(12) United States Patent
Shirai et al.

(10) Patent No.: US 8,239,744 B2
(45) Date of Patent: Aug. 7, 2012

(54) MEMORY SYSTEM WITH SEMICONDUCTOR MEMORY AND ITS DATA TRANSFER METHOD

(75) Inventors: Yutaka Shirai, Yokohama (JP); Keiji Maruyama, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 726 days.

(21) Appl. No.: 12/406,336

(22) Filed: Mar. 18, 2009

(65) Prior Publication Data

US 2009/0319871 A1 Dec. 24, 2009

(30) Foreign Application Priority Data

Jun. 24, 2008 (JP) ................................. 2008-164949

(51) Int. Cl.
*G06F 11/00* (2006.01)
(52) U.S. Cl. ....................................... 714/800; 714/801
(58) Field of Classification Search .................. 714/773, 714/800, 758, 768, 801, 803, 805
See application file for complete search history.

(56) References Cited

U.S. PATENT DOCUMENTS

| 7,076,722 | B2 | 7/2006 | Shibata | |
|---|---|---|---|---|
| 7,290,082 | B2 | 10/2007 | Kwon | |
| 2002/0166090 | A1* | 11/2002 | Maeda et al. | 714/746 |
| 2002/0184592 | A1* | 12/2002 | Koga et al. | 714/763 |
| 2004/0083334 | A1 | 4/2004 | Chang et al. | |
| 2006/0069977 | A1* | 3/2006 | Maeda et al. | 714/752 |
| 2008/0115043 | A1 | 5/2008 | Shimizume et al. | |

FOREIGN PATENT DOCUMENTS

KR 10-2004-0086923 10/2004
KR 10-2007-0076849 7/2007

OTHER PUBLICATIONS

Office Action issued Dec. 21, 2010, in Korea Patent Application No. 10-2009-0056069 (with English translation).

* cited by examiner

*Primary Examiner* — Dieu-Minh Le
(74) *Attorney, Agent, or Firm* — Oblon, Spivak, McClelland, Maier & Neustadt, L.L.P.

(57) ABSTRACT

A data transfer method includes reading data from a NAND flash memory in pages into a first buffer, transferring a parity in the data read into the first buffer to a second buffer, after transferring the parity to the second buffer, transferring a main data in the data read into the first buffer to the second buffer, on the basis of the parity, correcting an error in the main data transferred to the second buffer, and transferring an error-corrected main data to a third buffer.

19 Claims, 17 Drawing Sheets

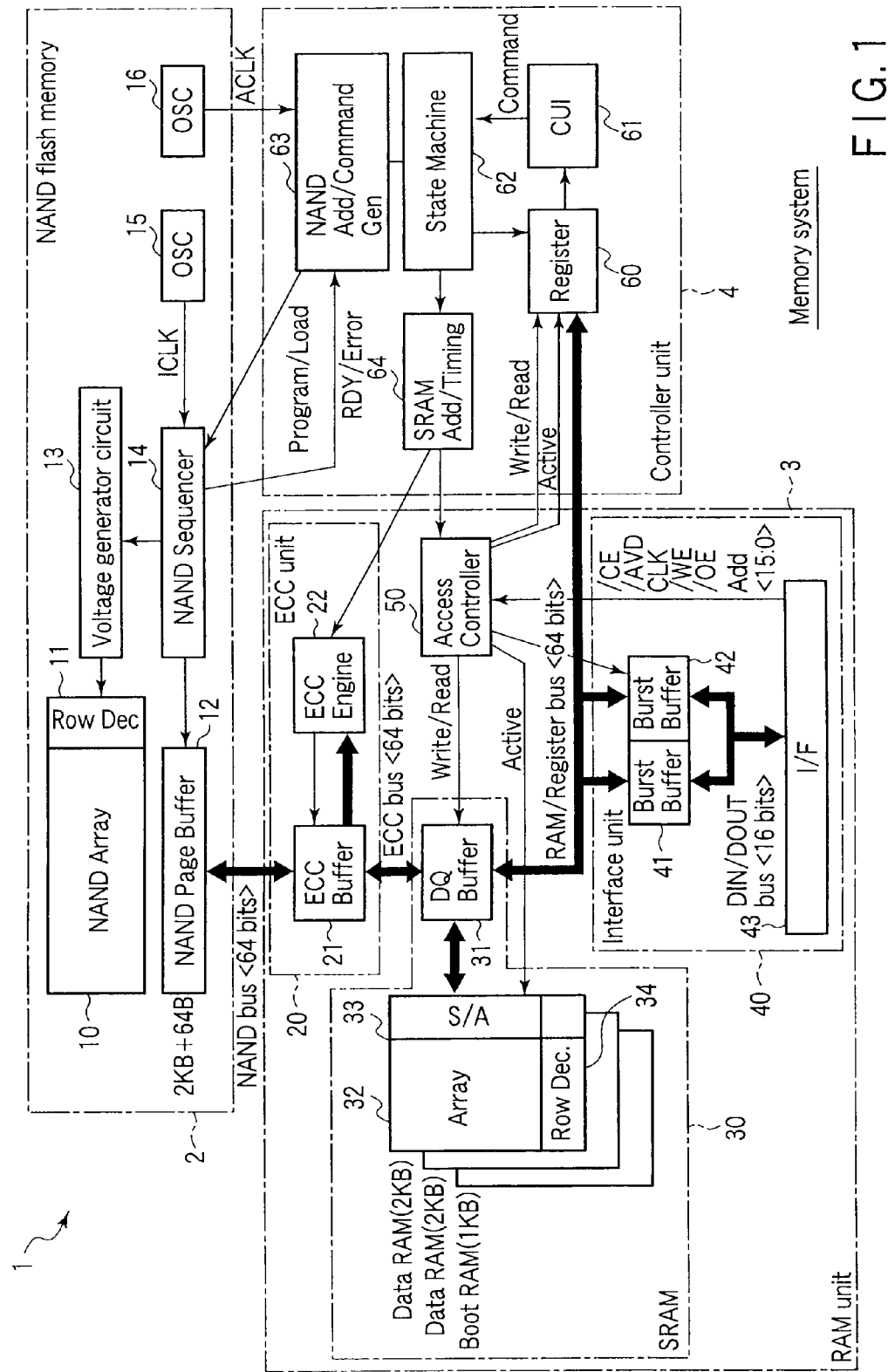
F I G. 1

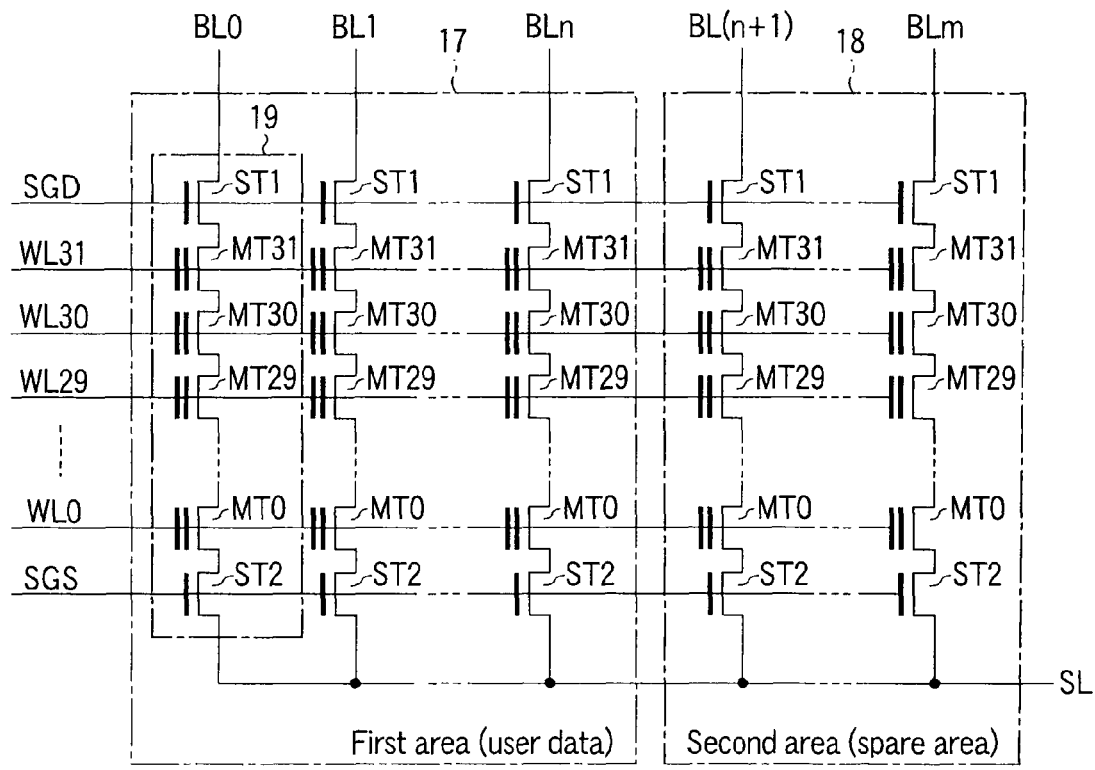
F I G. 2

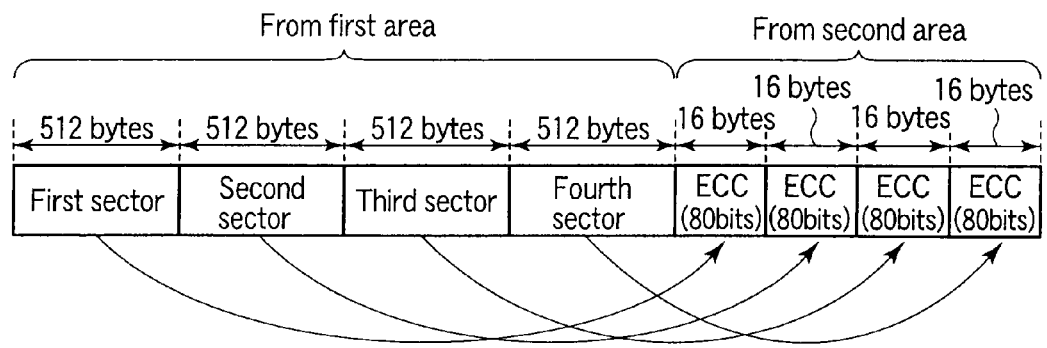
F I G. 3
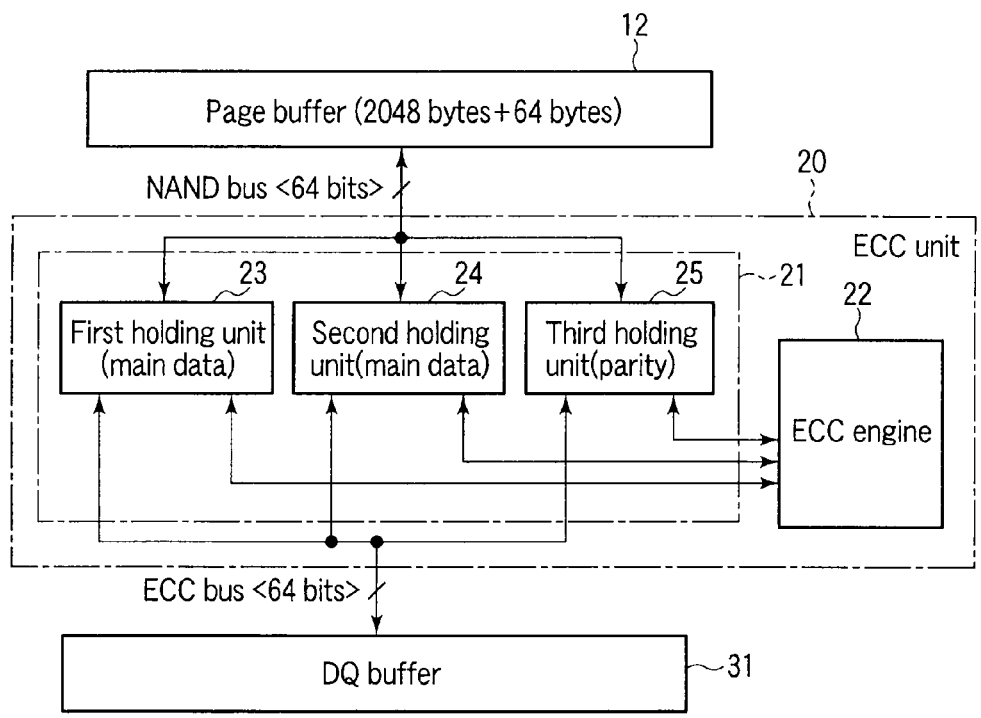
F I G. 4

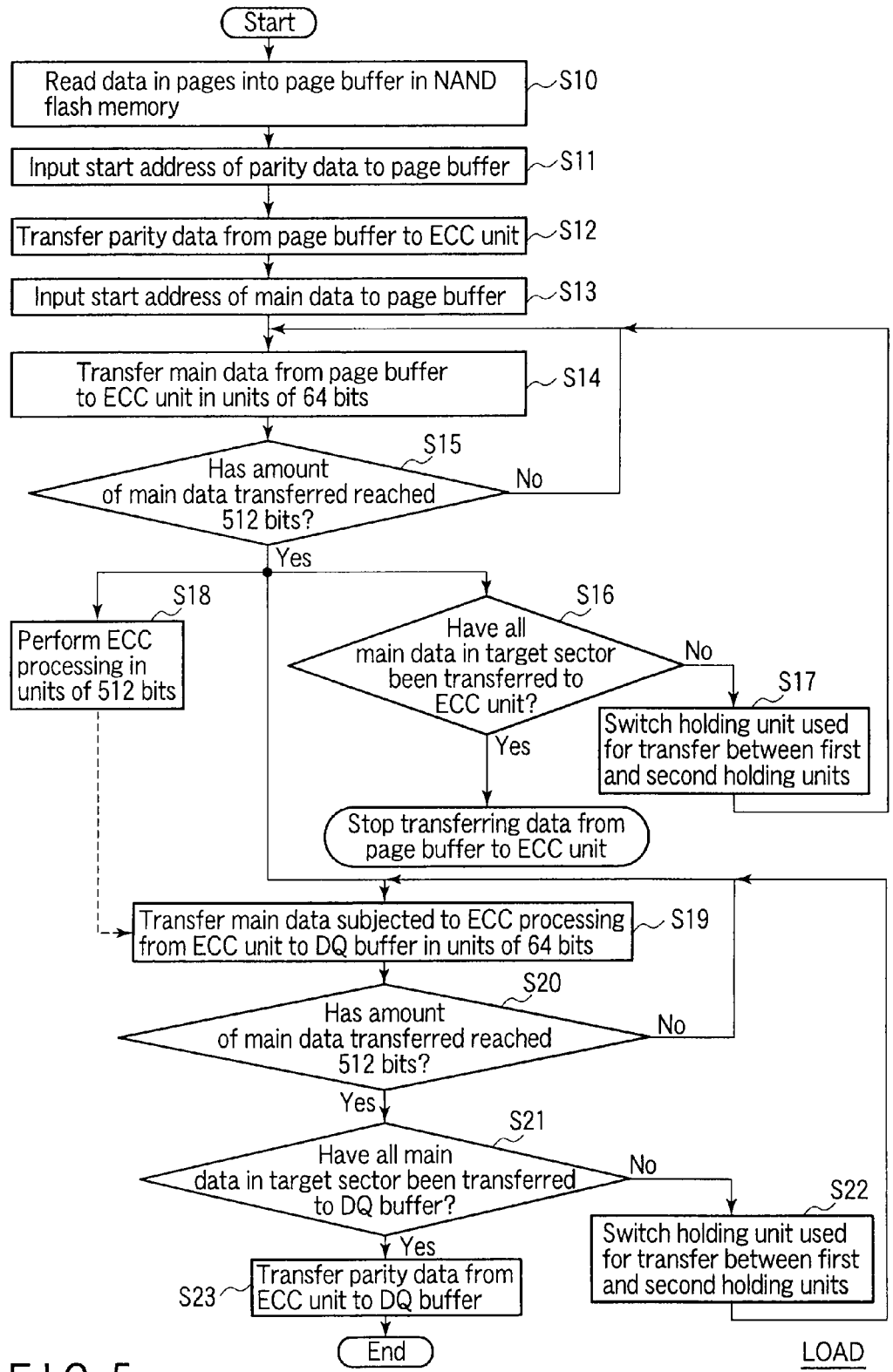
F I G. 5 t2 to t3 (step S12)

t4 to t5 (step S14)

t5 to t6 (steps S14 to S17, S18)

t6 to t7 (steps S14 to S17, S18)

F I G. 15    PROGRAM

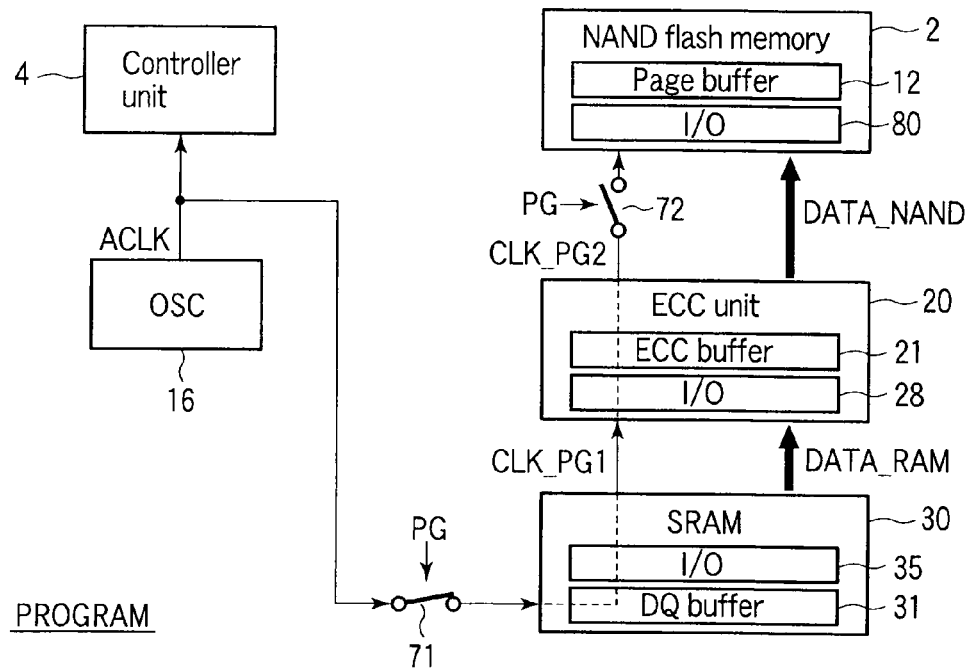
F I G. 20
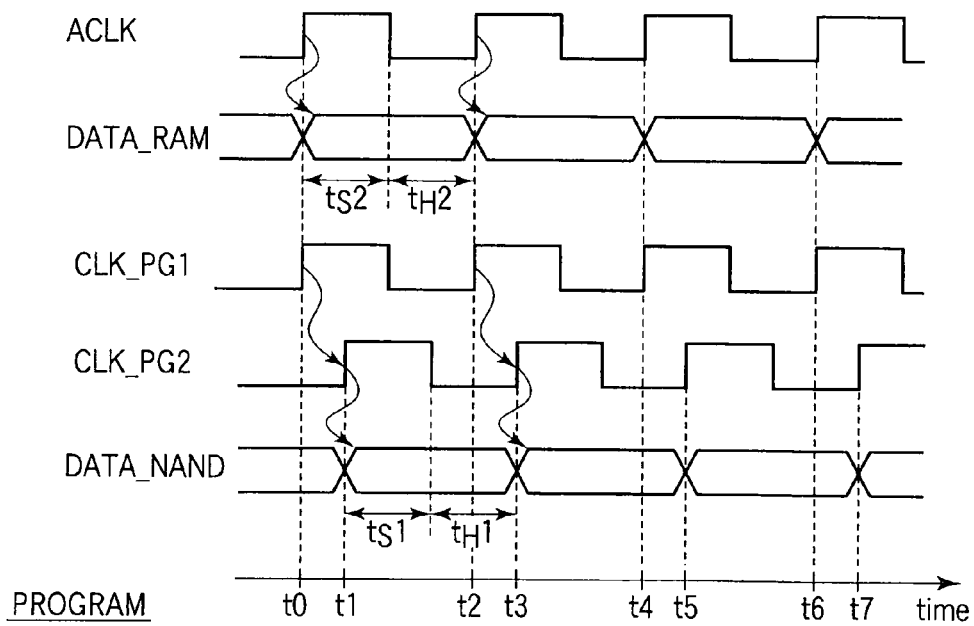
F I G. 21

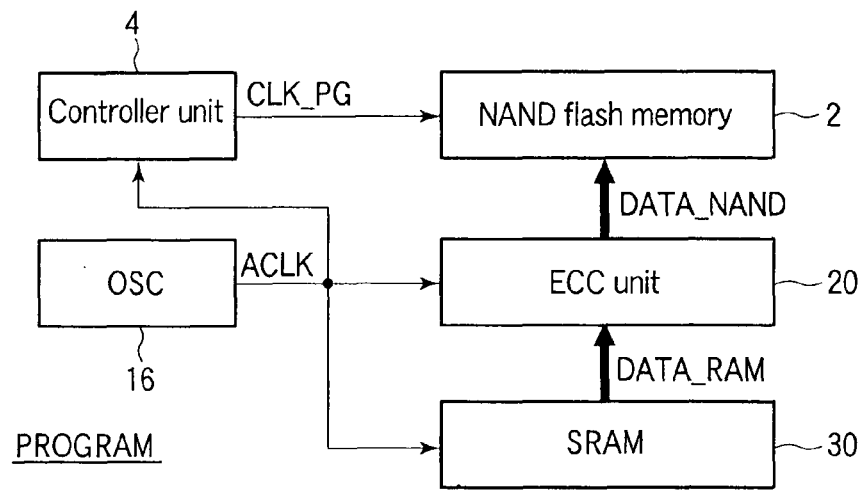
F I G. 24
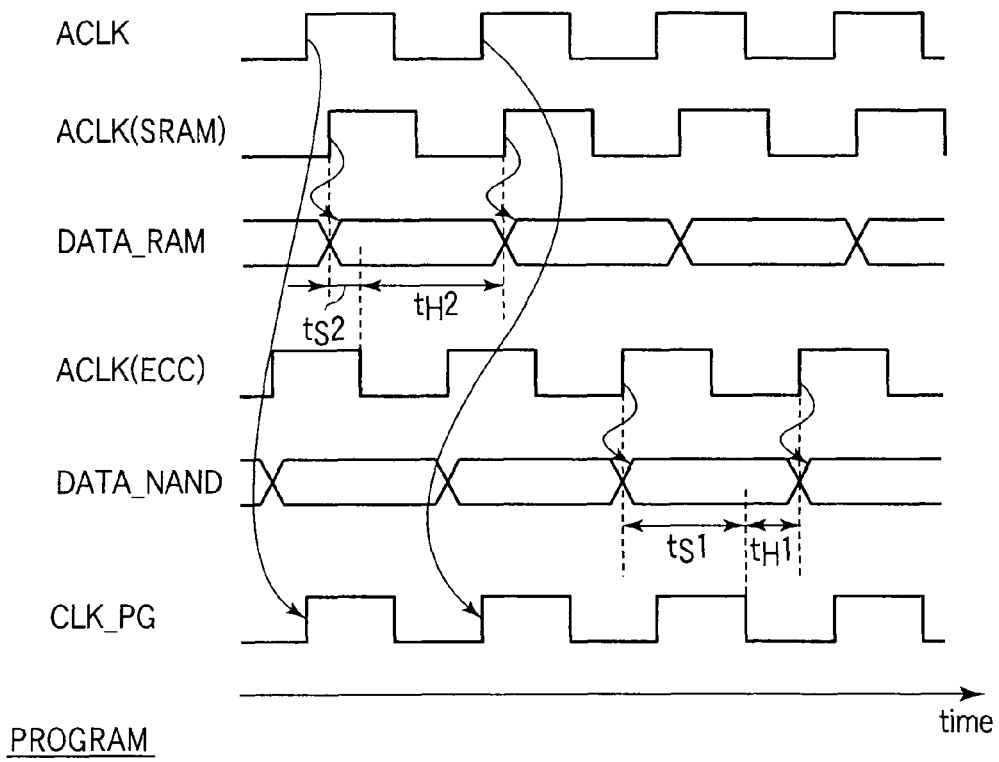
F I G. 25

MEMORY SYSTEM WITH SEMICONDUCTOR MEMORY AND ITS DATA TRANSFER METHOD

CROSS-REFERENCE TO RELATED APPLICATIONS

This application is based upon and claims the benefit of priority from prior Japanese Patent Application No. 2008-164949, filed Jun. 24, 2008, the entire contents of which are incorporated herein by reference.

BACKGROUND OF THE INVENTION

1. Field of the Invention

This invention relates to a memory system with semiconductor memory and its data transfer method, and more particularly to a data transfer method in a nonvolatile semiconductor memory with an error correcting function.

2. Description of the Related Art

A semiconductor memory with an error checking and correction (ECC) function is known. The ECC function is to check whether there is any error in the read-out data and, if an error is found, correcting the error. Such a function has been disclosed in, for example, U.S. Pat. No. 7,290,082.

A NAND flash memory has been widely known as a nonvolatile semiconductor memory. In the NAND flash memory, since an error will occur with certain probability, it is important to use the ECC function.

BRIEF SUMMARY OF THE INVENTION

A data transfer method according to an aspect of the present invention includes:

reading data from a NAND flash memory in pages into a first buffer;

transferring a parity in the data read into the first buffer to a second buffer;

after transferring the parity to the second buffer, transferring a main data in the data read into the first buffer to the second buffer;

on the basis of the parity, correcting an error in the main data transferred to the second buffer; and transferring an error-corrected main data to a third buffer.

A memory system according to an aspect of the present invention includes:

a NAND flash memory which is capable of holding data;

an ECC system which performs ECC processing on the data;

a buffer memory which is used to input and output the data to and from the NAND flash memory; and a controller which controls the operations of the NAND flash memory, the ECC system, and the buffer memory, a direction in which a clock is propagated between the NAND flash memory, ECC system, buffer memory, and controller being switched depending on whether the data is loaded or programmed.

BRIEF DESCRIPTION OF THE SEVERAL VIEWS OF THE DRAWING

FIG. 1 is a block diagram of a memory system according to a first embodiment of the invention;

FIG. 2 is a circuit diagram of a memory cell array according to the first embodiment;

FIG. 3 is a schematic diagram of page data according to the first embodiment;

FIG. 4 is a block diagram of an EEC unit according to the first embodiment;

FIG. 5 is a flowchart of a data transfer method according to the first embodiment;

FIG. 20 is a block diagram of the memory system according to the fourth embodiment;

FIG. 21 is a timing chart of data and a clock of the memory system in a program operation according to the fourth embodiment;

FIG. 24 is a block diagram of a memory system in a program operation; and

FIG. 25 is a timing chart of data and a clock in a program operation.

DETAILED DESCRIPTION OF THE INVENTION

First Embodiment

Figure 6:
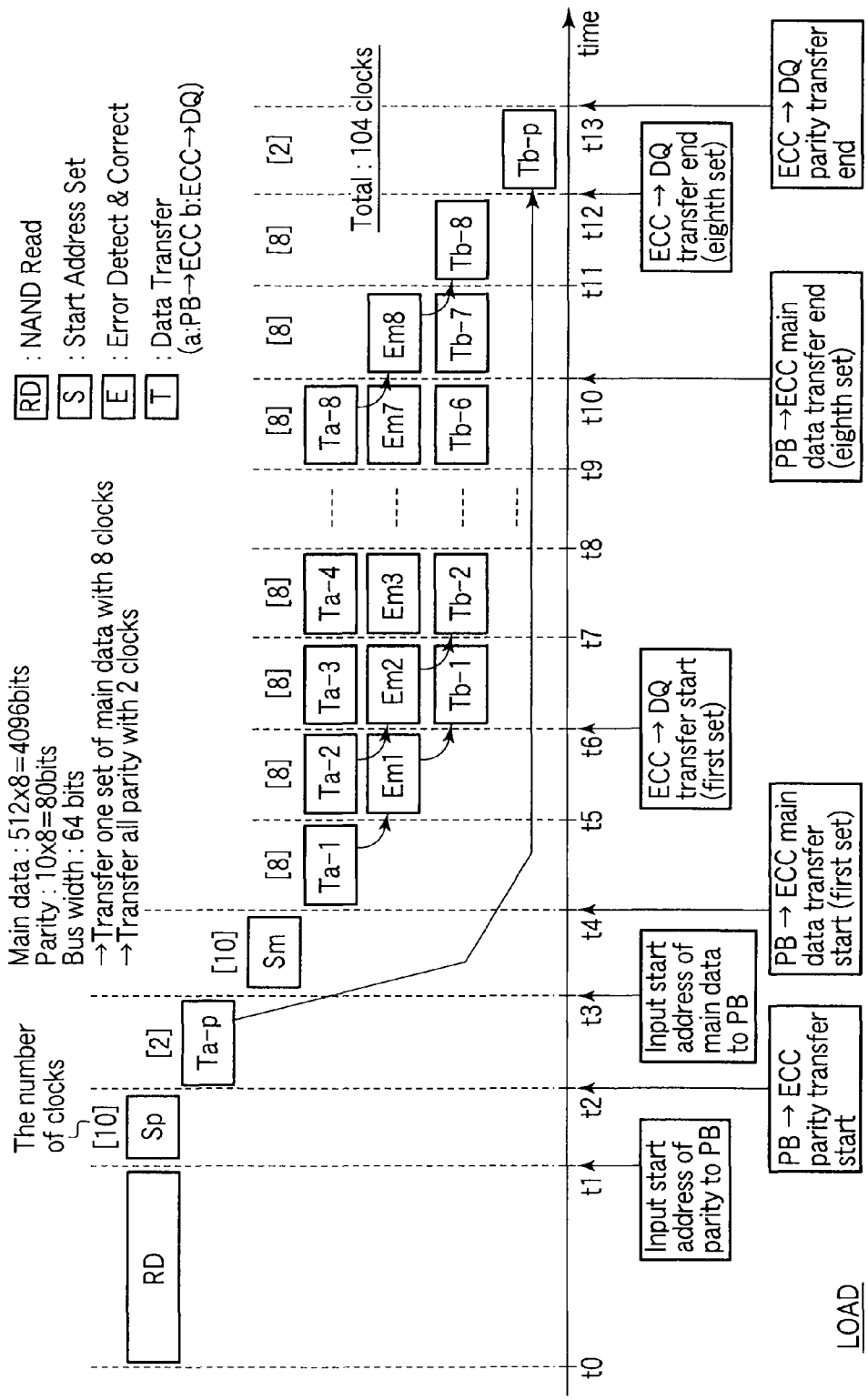
FIG. 6 is a timing chart of a data transfer method according to the first embodiment.

A memory system and a data transfer method according to a first embodiment of the invention will be explained using FIG. 1. FIG. 1 is a block diagram of a memory system which realizes a data transfer method according to the first embodiment.

<Overall Configuration of Memory System>

As shown in FIG. 1, the memory system 1 includes a NAND flash memory 2, a RAM unit 3, and a controller unit 4. The NAND flash memory 2, RAM unit 3, and controller unit 4 are formed on the same semiconductor substrate so as to be integrated into one chip. Hereinafter, each of the blocks will be explained in detail.

<NAND Flash Memory 2>

The NAND flash memory 2 functions as a main storage unit of the memory system 1. As shown in FIG. 1, the NAND flash memory 2 includes a memory cell array 10, a row decoder 11, a page buffer 12, a voltage generator circuit 13, a sequencer 14, and oscillators 15, 16.

The memory cell array 10 includes a plurality of memory cell transistors capable of holding data. FIG. 2 is a circuit diagram of the memory cell array 10. As shown in FIG. 2, the memory cell array 10 generally includes a first area 17 and a second area 18. The first 17 holds net data, such as user data, (hereinafter, referred to as main data). The second area 18, which is used as a spare area for the first area 17, holds, for example, error correction information (e.g., parity). Each of the first area 17 and second area 18 includes a plurality of memory cell units 19. Each of the memory cell units 19 includes, for example, 32 memory cell transistors MT0 to MT31 and select transistors ST1, ST2. Hereinafter, when the memory cell transistors MT0 to MT31 are not distinguished from one another, they are simply referred to as the memory cell transistors MT. Each of the memory cell transistors has a stacked gate structure which includes a charge storage layer (e.g., floating gate) formed on a semiconductor substrate with a gate insulating film interposed therebetween and a control gate formed on the charge storage layer with an inter-gate insulating film interposed therebetween. The number of memory cell transistors MT is not limited to 32 and may be 8, 16, 64, 128, 256, or the like. The memory cell transistors MT may have a metal-oxide-nitride-oxide-silicon (MONOS) structure using a method of causing a nitride film to trap electrons.

The memory cell transistors MT are connected in such a manner that adjacent ones share the drain and source. Moreover, the memory cell transistors are arranged in such a manner that their current paths are connected in series between select transistor ST1 and ST2. The drain of one end side of the memory cell transistors MT connected in series is connected to the source of select transistor ST1. The source of the other end side is connected to the drain of select transistor ST2.

The control gates of the memory cell transistors in the same row are connected commonly to any one of word lines WL0 to WL31. The gates of select transistors ST1 in the same row are connected commonly to select gate line SGD. The gates of select transistors ST2 in the same row are connected commonly to select gate line SGS. For ease of explanation, hereinafter, word lines WL0 to WL31 may be simply referred to as word lines WL. The word lines WL and select gate lines SGD, SGS are shared by the first area 17 and second area 18.

In the first area 17, the drains of the select transistors ST1 in the same column are connected commonly to bit lines BL0 to BLn (n is a natural number). In the second area 18, the drains of the select transistors ST1 in the same column are connected commonly to bit lines BL(n+1) to BLm (m is a natural number). Bit lines BL0 to BLm may be simply referred to as bit lines BL. The sources of select transistors ST2 are connected equally to a source line SL. Both of select transistors ST1, ST2 are not necessarily needed. As long as the memory cell unit 19 can be selected, only one of select transistors ST1, ST2 may be provided.

With this configuration, data is simultaneously written to or read from a plurality of memory cell transistors connected to the same word line WL. The write unit or read unit is termed a page. Moreover, the data in a plurality of memory cell units 19 in the same row are erased simultaneously. The erasing unit is termed a memory block.

Each of the memory cell transistors MT can hold one bit of data according to, for example, a change in the threshold voltage of the transistor depending on the number of electrons injected into the charge accumulation layer. Control of the threshold voltage may be so segmented that 2 bits or more of data are held in each of the memory cell transistors MT.

FIG. 3 schematically shows one page of data read from the memory cell array 10 of FIG. 2 or programmed in the memory cell array 10. FIG. 3 corresponds to the configuration of the page buffer 12.

As shown in FIG. 3, main data read from the first area 17 or programmed in the first area includes four sectors (first sector to fourth sector) each having a size of, for example, 512 bytes. Thus, it follows that the size of the main data is (512 bytes× 4)=2048 bytes (=2 Kbytes where K equals 1024). Moreover, for example, 64 bytes of data are programmed in or read from the second area 18. For error correction parity, for example, 80 bits are prepared for each sector. Accordingly, when the main data includes 4 sectors, (80 bits×4)=320 bits out of the 64 bytes of data corresponding to the second area 18 are for error correction parity.

As described above, the data size of one page is (2048+64) bytes. Data of this size are programmed simultaneously in or read from the memory cell array 10. The data may be read from all the memory cell transistors MT connected to the same word line WL. In this case, the number of bit lines BL connected to the first area 17 is 16384 (n=16383) and the number of bit lines BL connected to the second area is 512 (m=16895). Data may be programmed or read for, for example, every even-numbered bit line or every odd-numbered bit line. In this case, the number of bit lines is doubled.

To return to FIG. 1, the explanation of the configuration of the NAND flash memory 2 will be resumed. When data is programmed, read, or erased, the row decoder 11 selects a word line WL and select gate lines SGD, SGS. Then, the row decoder 11 applies the necessary voltages to the word line WL and select gate liens SGD, SGS.

The page buffer 12, which is configured to be capable of holding a page size of data, temporarily holds data given from the RAM unit 3 and writes the data to the memory cell array 10 in a data programming operation. In a read operation, the page buffer 12 temporarily holds the data read from the memory cell array 10 and transfers the data to the RAM unit 3. Then, as shown in FIG. 3, a part of the area is used to hold the main data and the rest is used to hold parity and others.

The voltage generator circuit 13 steps up or down a voltage supplied from the outside, thereby generating voltages necessary for data programming, reading, and erasing. The voltage generator circuit 13 supplies the generated voltage to, for example, the row decoder 11. The voltage generated at the voltage generator circuit 13 is applied to the word line WL.

The sequencer 14 supervises the overall operation of the NAND flash memory 2. Specifically, when receiving a program instruction ("Program" shown in FIG. 1), a load instruction ("Load" shown in FIG. 1), or an erase instruction (not shown) from the controller unit 4, the sequencer 14, in response to this, executes the sequence of data programming, reading, and erasing. Then, according to the sequence, the sequencer 14 controls the operation of the voltage generator circuit 13 and that of the page buffer 12.

The oscillator 15 generates an internal clock ICLK. That is, the oscillator 15 functions as a clock generator. The oscillator 15 supplies the generated internal clock ICLK to the sequencer 14. The sequencer 14 operates in synchronization with the internal clock ICLK.

The oscillator 16 generates an internal clock ACLK. That is, the oscillator 16 functions as a clock generator. The oscillator 16 supplies the generated internal clock ACLK to the controller unit 4 and RAM unit 3. The internal clock ACLK is a reference clock for the operation of the controller unit 4 and RAM unit 3.

<RAM Unit 3>

Referring to FIG. 1, the RAM unit 3 will be explained. The RAM unit 3 includes an ECC unit 20, a static random access memory (SRAM) 30, an interface unit 40, and an access controller 50. Hereinafter, each of them will be described.

In the memory system 1 of the first embodiment, the NAND flash memory 2 functions as a main storage unit and the SRAM 30 of the RAM unit 3 functions as a buffer. Accordingly, when data is read from the NAND flash memory 2 to the outside, first, the data read from the memory cell array 10 of the NAND flash memory 2 is stored in the SRAM 30 of the RAM unit 3 via the page buffer 12. Thereafter, the data in the SRAM 30 is transferred to the interface unit 40, which then outputs the data to the outside. When data is stored in the NAND flash memory 2, first, data supplied from the outside is stored in the SRAM 30 of the RAM unit 3 via the interface unit 40. Thereafter, the data in the SRAM 30 is transferred to the page buffer 12, which then writes the data to the memory cell array 10.

Hereinafter, the operation from when the data is read from the memory cell array 10 until the data is transferred to the SRAM 30 via the page buffer 12 is referred to as "loading" data. The operation of the data in the SRAM 30 being transferred to the interface 43 via burst buffers 41, 42 (explained later) in the interface unit 40 is referred to as "reading" data.

Furthermore, the operation of data to be stored in the NAND flash memory 2 being transferred from the interface 43 to the SRAM 30 via the burst buffers 41, 42 is referred to as "writing" data. The operation from when the data in the SRAM 30 is transferred to the page buffer 12 until the data is written to the memory cell array 10 of the NAND flash memory 2 is referred to as "programming" data.

<<ECC Unit 20>>

The ECC unit 20 detects and corrects an error in data and generates parity (hereinafter, these processes may be collectively referred to as ECC processing). Specifically, in loading data, the ECC unit detects and corrects an error in the data read from the NAND flash memory 2. In programming data, the ECC unit generates parity for data to be programmed. The ECC unit 20 includes an ECC buffer 21 and an ECC engine 22.

The ECC buffer 21 is connected to the page buffer 12 of the NAND flash memory 2 through a NAND bus and to the SRAM 30 through an ECC bus. The NAND bus and ECC bus have the same bus width, which is contains, for example, 64 bits. In loading data, the ECC buffer 21 not only holds the data transferred via the NAND bus from the page buffer 12 but also transfers the data subjected to ECC processing to the SRAM 30 via the ECC bus. In programming data, the ECC buffer 21 not only holds the data transferred via the ECC bus from the SRAM 30 but also transfers the transferred data and parity to the page buffer 12 via the NAND bus.

The ECC engine 22 carries out ECC processing using the data held in the ECC buffer 21. The ECC engine uses a 1-bit correcting method using, for example, hamming code. The ECC engine 22 uses the minimum amount of parity data necessary for error processing. The ECC engine 22 performs ECC processing on each of the sectors explained in FIG. 3 in units of 512 bits. That is, to correct one bit in $2^k$ bits (k is a natural number), (k+1) bits of parity are needed. Thus, when ECC processing is carried out in units of 512 bits, 10 bits of parity are needed for every 512 bits since k=9.

Specifically, in loading data, the ECC engine 22 generates a syndrome using 10 bits of parity for every 512 bits and detects an error using the syndrome. If having detected an error, the ECC engine corrects it. In programming data, the ECC engine generates 10 bits of parity for every 512 bits.

FIG. 4 is a block diagram of the ECC unit 20, page buffer 12, and a DQ buffer 31. The DQ buffer 31 is a buffer included in the SRAM 30. As shown in FIG. 4, the ECC buffer 21 includes first to third holding units 23 to 25. The first to third holding units 23 to 25 transfer data between the page buffer 12 and DQ buffer 31 in units of, for example, 64 bits. Each of the first and second holding units 23, 24 is capable of holding 512 bits of main data. The third holding unit 25 holds the parity transferred from the page buffer 12 in loading data and the parity generated at the ECC engine 22 in programming data.

Then, the ECC engine 22 performs ECC processing using the data in the first to third holding units 23 to 25.

<<SRAM 30>>

Next, to return to FIG. 1, the SRAM 30 will be explained. In the memory system 1, the SRAM 30 functions as a buffer memory for the NAND flash memory 2. As shown in FIG. 1, the SRAM 30 includes the DQ buffer 31, a plurality of data RAMs (two RAMs in the first embodiment), and a boot RAM.

The DQ buffer 31 writes data to the data RAMs or boot RAM or temporarily holds data in a read operation. As described above, the DQ buffer 31 is configured to be capable of exchanging data with the ECC buffer 21 through the ECC bus. Moreover, the DQ buffer 31 is configured to be capable of exchanging data with the interface unit 40 through a RAM/Register bus having a bus width of, for example, 64 bits. Like the page buffer 12, the DQ buffer 31 includes an area for holding main data and an area for holding parity and others.

The boot RAM temporarily holds boot code for starting up, for example, the memory system 1. The capacity of the boot RAM is, for example, 1 Kbyte. The data RAM temporarily holds data (main data and parity) other than the boot code. The capacity of the data RAM is, for example, 2 Kbytes. Two units of the data RAM are provided. Each of the data RAM and boot RAM includes a memory cell array 32, a sense amplifier 33, and a row decoder 34.

The memory cell array 32 includes a plurality of SRAM cells capable of holding data. Each of the SRAM cells is connected to a word line and a bit line. Like the memory cell array 10, the memory cell array 32 includes an area for holding main data and an area for holding parity and others. The sense amplifier 33 senses and amplifies the data read onto a bit line from an SRAM cell. Moreover, the sense amplifier 33 functions as a load in writing the data in the DQ buffer 31 to the SRAM cells. The row decoder 34 selects a word line in the memory cell array 32.

<<Interface Unit 40>>

Next, the interface unit 40 will be explained, referring to FIG. 1. As shown in FIG. 1, the interface unit 40 includes a plurality of burst buffers (two burst buffers in the first embodiment) 41, 42 and an interface 43.

The interface 43, which is capable of connecting with a host unit outside the memory system 1, supervises the input and output of various signals, including data, control signals, and addresses Add, to and from the host unit. Examples of the control signals include a chip enable signal /CE which enables the whole of the memory system 1, an address valid signal /AVD which is for causing an address to be latched, a clock CLK for burst read, a write enable signal /WE which enables a write operation, and an output enable signal /OE which enables the output of data to the outside.

The interface 43 is connected to the burst buffer 41, 42 through a DIN/DOUT having a bus width of, for example, 16 bits. The interface 43 transfers control signals related to a data read request, load request, write request, program request, and the like from the host unit to the access controller 50. Then, in reading data, the interface 43 outputs the data in the burst buffers 41, 42 to the host unit. In writing data, the interface 43 transfers the data supplied from the host unit to the burst buffers 41, 42.

The burst buffers 41, 42 are configured to be capable of exchanging data not only with the DQ buffer 31 and controller unit 4 through the RAM/Register bus but also with the interface 43 through the DIN/DOUT bus. The burst buffer 41, 42 temporarily hold the data supplied from the host unit via the interface 43 or the data supplied from the DQ buffer 31.

<<Access Controller 50>>

The access controller 50 receives the control signal and an address from the interface 43 and controls the SRAM 30 and controller unit 4 so as to carry out an operation to meet the request of the host unit.

More specifically, according to the request of the host unit, the access controller 50 brings either the SRAM 30 or a register 60 (described later) of the controller 4 into the active state. Then, the access controller 50 issues a data write command or read command ("Write/Read" shown in FIG. 1) to the SRAM 30. Alternatively, the controller 50 issues a data write command or read command ("Write/Read") to the register 60 (hereinafter, the command is referred to as a register write command or register read command). As a result of the issue of those commands, the SRAM 30 and controller unit 4 start to operate.

<Controller Unit 4>

Next, the controller unit 4 will be explained, referring to FIG. 1. The controller unit 4 controls the operation of the NAND flash memory 2 and RAM unit 3. That is, the controller unit 4 has the function of supervising the overall operation of the memory system 1. As shown in FIG. 1, the controller unit 4 includes a register 60, a command user interface 61, a state machine 62, an address/command generator circuit 63, and an address/timing generator circuit 64.

The register 60 is for setting the operating state of a function. Specifically, the register 60 sets the operating state of a function according to a register write command or a register read command supplied from the access controller 50. More specifically, for example, in loading data, a load command is set in the register 60. In programming data, a program command is set in the register 60.

When a specific command has been set in the register 60, the command user interface 61 recognizes that a function execute command has been given to the memory system 1. Then, the command user interface 61 issues an internal command signal ("Command" shown in FIG. 1) and outputs it to the state machine 62.

On the basis of the internal command signal given by the command user interface 61, the state machine 62 controls the sequence operation in the memory system 1. The state machine 62 supports many functions, including load, program, and erase. The state machine 62 controls the operation of the NAND flash memory 2 and RAM unit 3 so as to execute those functions. As described above, "load" is the operation of reading data from the NAND flash memory 2 and outputting the data to the SRAM 30. "Program" is the operation of storing RAM data in the NAND flash memory 2. "Erase" is the operation of erasing data in the NAND flash memory 2.

The address/command generator circuit 63 controls the operation of the NAND flash memory 2 under the control of the state machine 62. More specifically, the address/command generator circuit 63 generates an address, a command ("Program/Load" shown in FIG. 1), or the like and outputs it to the NAND flash memory 2. The address/command generator circuit 63 outputs these address and command in synchronization with an internal clock ACLK generated by the oscillator 16.

The address/timing generator circuit 64 controls the operation of the RAM unit 3 under the control of the state machine 62. More specifically, the address/timing generator circuit 64 issues an address and command necessary for the RAM unit 3 and outputs them to the access controller 50 and ECC engine 22.

<Operation of Memory System 1>

Next, the operation of the memory system 1 configured as described above will be explained briefly. In the memory system 1 of the first embodiment, the NAND flash memory 2 and the host unit exchange data via the SRAM 30.

Specifically, when the host unit stores data in the NAND flash memory 2 of the memory system 1, the data is stored temporarily in either the data RAM or boot RAM according to the write command given by the host unit and the address of the SRAM 30. Thereafter, the data stored in the SRAM 30 is programmed in pages simultaneously in the NAND flash memory 2 according to the program command given by the host unit and the address of the NAND flash memory 2.

When the host unit reads data in the NAND flash memory 2, first, the data is read from the NAND flash memory 2 according to the load command given by the host unit, the address of the NAND flash memory 2, and the address of the SRAM 30 and is stored in either the data RAM or boot RAM temporarily. Thereafter, according to the read command given by the host unit and the address of the SRAM 30, the data held in either the data RAM or boot RAM is read into the host unit via the interface unit 40.

Hereinafter, an example of a load procedure will be explained briefly.

First, the host unit inputs not only the address in the NAND flash memory 2 to be loaded and the address of the SRAM but also a load command to the interface unit 40.

Then, in the memory system 1, the access controller 50 sets the addresses and command in the register 60. Having sensed that the command has been set in the register 60, the command user interface 61 issues an internal command signal. In the case of loading, the command user interface 61 issues a load command.

Receiving the load command from the user interface 61, the state machine 62 starts up. After the necessary initialization of each circuit block, the state machine 62 requests the address/command generator circuit 63 to issue a sense command to the NAND flash memory 2.

Then, the address/command generator circuit 63 issues a sense command to the sequencer 14 to sense the data in the address set in the register 60.

Receiving the sense command from the address/command generator circuit 63, the sequencer 14 starts up. After the necessary initialization of the NAND flash memory 2, the sequencer 14 senses the specified address. Specifically, the sequencer 14 controls the voltage generator circuit 13, row decoder 11, sense amplifier (not shown), and page buffer 12 and stores the sensed data in the page buffer 12. Thereafter, the sequencer 14 informs the state machine 62 of the completion of the sense operation.

Next, the state machine 62 instructs the address/command generator circuit 63 to issue a transfer command to the NAND flash memory 2. The transfer command is an instruction to transfer data from the NAND flash memory 2 to the RAM unit 3. According to the instruction, the address/command generator circuit 63 issues a transfer command and outputs it to the sequencer 14.

Receiving the transfer command, the sequencer 14 sets the page buffer 12 so as to be capable of transferring data. Under the control of the sequencer 14, the data in the page buffer 12 is transferred to the ECC buffer 21 via the NAND bus.

Moreover, the state machine 62 issues an error correction start control signal to the ECC unit 20. In response to this signal, the ECC unit 20 carries out ECC processing. Then, the data subjected to ECC processing is transferred from the ECC unit 20 to the DQ buffer 31 via the ECC bus.

Then, according to the instruction of the access controller 50, the data in the DQ buffer 31 is written to the memory cell array 32 of the SRAM 30.

This completes the operation of loading the data. Thereafter, the host unit issues a read command via the interface unit 40, thereby reading the data written to the memory cell array 32.

<Method of Transferring Data Between the Page Buffer 12, ECC Unit 20, and DQ Buffer 31>

Next, a method of transferring data between the page buffer 12, ECC unit 20, and DQ buffer 31 in loading data will be explained in detail, using FIG. 5. FIG. 5 is a flowchart of a data transfer method according to the first embodiment.

As shown in FIG. 5, first, in the NAND flash memory 2, data is read in pages into the page buffer 12 (step S10). The page data includes 2 Kbytes of data read from the first area 17 and 64 bytes of data read from the second area. The data read from the second area includes 320 bits of parity.

Thereafter, in response to the instruction from the address/command generator circuit 62, the sequencer 14 inputs the start address of the parity to the page buffer 12 of the NAND flash memory 2 (step S11). As a result, the page buffer 12 transfers the parity to the third holding unit 25 of the ECC buffer 21 in units of 64 bits (step S12).

Then, according to the instruction from the address/command generator circuit 62, the sequencer 14 inputs the start address of the main data to the page buffer 12 (step S13). As a result, the page buffer 12 transfers the main data to either the first holding unit 23 or second holding unit 24 of the ECC buffer 21 in units of 64 bits (step S14).

If the amount of main data transferred has reached 512 bits (YES in step S15) and the data in the target sector has been transferred (YES in step S16), the transfer of data in the sector from the page buffer 12 to the ECC buffer 21 is stopped. If the target sector still holds data to be transferred (NO in step S16), the page buffer 12 switches the data transfer destination between the first and second holding units 23, 24 (step S17) and resumes transferring the main data (step S14).

If the amount of main data transferred has reached 512 bits in step S15, the ECC engine 22 performs ECC processing in units of 512 bits (step S18). That is, the ECC engine generates a syndrome using the parity and main data and detects an error in the data. If the ECC engine has detected an error, it corrects the error. Moreover, if there is main data subjected to ECC processing, the main data is transferred from the ECC buffer 21 to the DQ buffer 31 (step S19).

If the amount of main data transferred to the DQ buffer 31 has reached 512 bits (YES in step S20) and the data in the target sector has all been transferred (YES in step S21), the third holding unit 25 finally transfers the parity to the DQ buffer (step S23), which completes the process. If the target sector still holds data to be transferred to the DQ buffer 31 (NO in step S21), the ECC buffer 21 switches the data sender between the first and second holding units 23, 24 (step S22) and resumes transferring the main data (step S19).

The process of transferring the main data from the page buffer 12 to the ECC buffer 21 in steps S14 to S27, the ECC processing in step S18, and the process of transferring main data from the ECC buffer 21 to the DQ buffer 31 in steps S19 to S22 are carried out in parallel with one another. More specifically, the main data is transferred in units of 512 bits, while switching between the first holding unit 23 and the second holding unit 24. This will be explained in detail below, using a concrete example.

Concrete Example

A concrete example of the data transfer will be explained using FIGS. 6 to 10. FIG. 6 is a timing chart to explain the flow of processing from when data starts to be read from the memory cell array 10 until the main data and parity are transferred to the DQ buffer 31. FIGS. 7 to 10 are block diagrams of the related circuit blocks in transferring data. In FIG. 6, a number sandwiched between "[" and "]" represents the number of clocks necessary to carry out the corresponding process.

<<Time t0 to Time t1>>

As shown in FIG. 6, in the period between time t0 and time t1, the data (main data+parity) are read from the memory cell array 10 into the page buffer 12 (step S10).

<<Time t1 to Time t3>>

Figure 7:
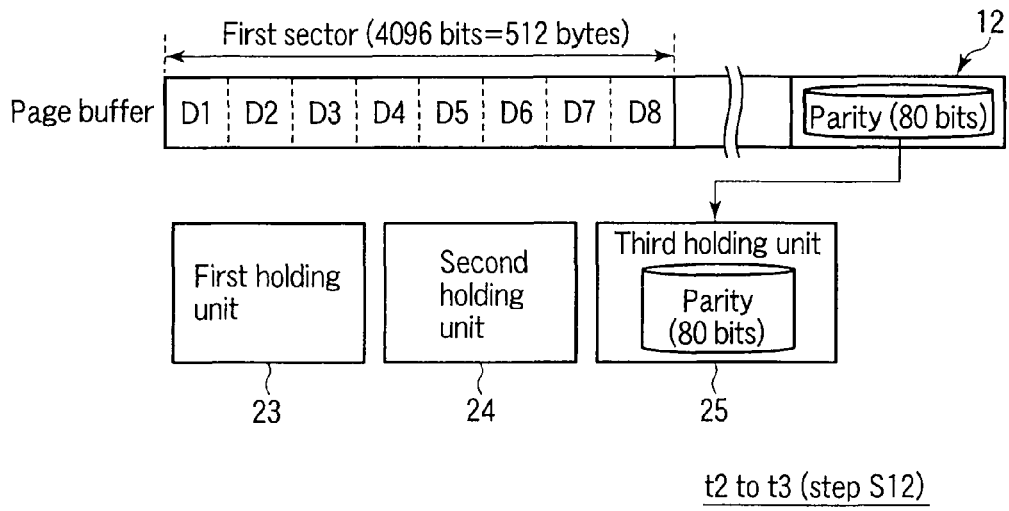
FIGS. 7 to 10 are block diagrams of the memory system according to the first embodiment.

Thereafter, at time t1, the start address of the parity is input to the page buffer 12 (step S11, "Sp" in FIG. 6). The input of the start address of the parity requires, for example, 10 clocks. Following this, at time t2, the parity is transferred from the page buffer 12 to the third holding unit 25 (step S12, "Ta-p" in FIG. 6). FIG. 7 shows this. As shown in FIG. 7, if, for example, a first sector is to be subjected to ECC processing, the parity (80 bits) corresponding to the first sector is transferred to the third holding unit 25. Since the NAND bus has a 64-bit width, the transfer of the parity needs 2 clocks. Hereinafter, the first sector of the main data is referred to as data D1 to data D8 sequentially in units of 512 bits.

<<Time t3 to Time t5>>

Figure 8:
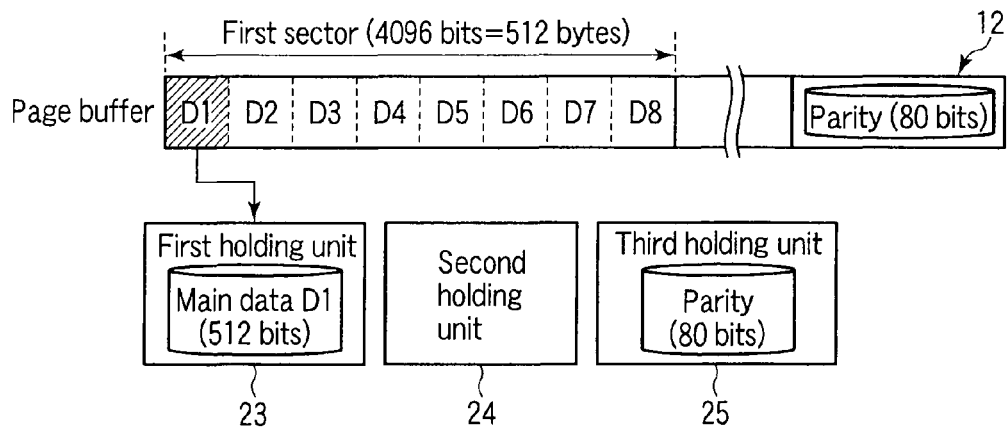

Next, the processes in the period from time t3 to time t5 will be explained, referring to FIG. 8. At time t3, the start address of the main data is input to the page buffer 12 (step S13, "Sm" in FIG. 6). The input of the start address of the main data requires, for example, 10 clocks. Following this, at time t4, the main data (data D1) is transferred from the page buffer 12 to the first holding unit 23 (step S14, "Ta-1" in FIG. 6). The transfer of 512 bits of data (data D1) requires 8 clocks. At time t5, the transfer of data D1 is completed.

<<Time t5 to Time t6>>

Figure 9:
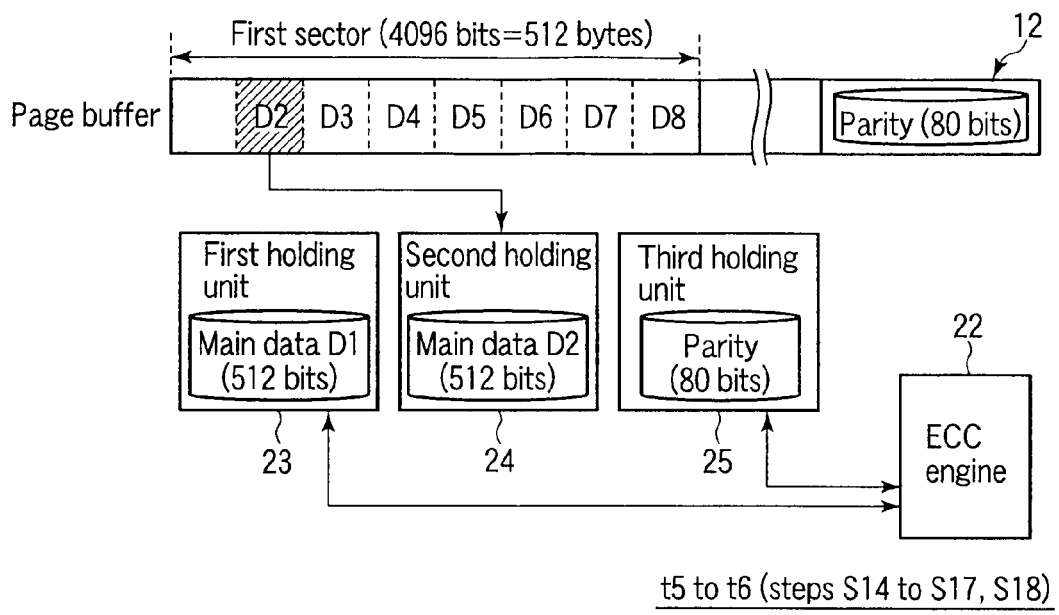

Next, the processes in the period from time t5 to time t6 will be explained, referring to FIG. 9. At time t5, the page buffer 12 switches the transfer destination from the first holding unit 23 to the second holding unit 24 (step S17) and starts to transfer data D2 following data D1 to the second holding unit 24 (step S14, "Ta-2" in FIG. 6). The transfer of data D2 also needs 8 clocks. At time t6, the transfer of data D2 is completed. At the same time, the ECC engine 22 carries out ECC processing using data D1 in the first holding unit 23 and the parity in the third holding unit 25 (step S18, "Em-1" in FIG. 6).

<<Time t6 to Time t7>>

Figure 10:
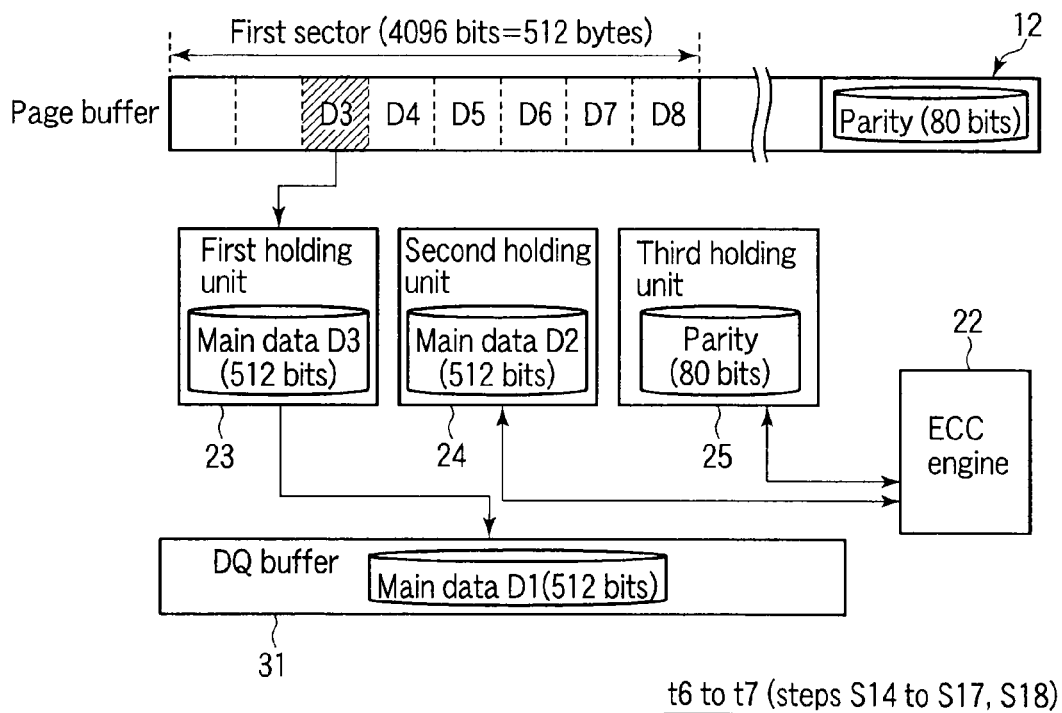

Next, the processes in the period from time t6 to time t7 will be explained, referring to FIG. 10. At time t6, the page buffer 12 switches the transfer destination from the second holding unit 24 to the first holding unit 23 (step S17) and starts to transfer data D3 following data D2 to the first holding unit 23 (step S14, "Ta-3" in FIG. 6). The transfer of data D3 also needs 8 clocks. At time t7, the transfer of data D3 is completed. At the same time, the ECC engine 22 carries out ECC processing using data D2 in the second holding unit 24 and the parity in the third holding unit 25 (step S18, "Em-2" in FIG. 6). Moreover, in parallel with the transfer of data D3 and ECC processing performed on data D2, data D1 subjected to ECC processing is transferred from the first holding unit 23 to the DQ buffer 31 (step S19, "Tb-1" in FIG. 6).

<<Time t7 to Time t10>>

From this time on, in the period between time t7 and time t10, the processes in the period from time t6 to time t7 explained above will be repeated. That is, in the period from time t7 to time t8, the transfer of data D4 from the page buffer 12 to the second holding unit 24, the ECC processing performed on data D3 by the ECC engine, and the transfer of data D2 subjected to ECC processing to the DQ buffer 31 are executed simultaneously. The rest is as described above.

<<Time t10 to Time t12>>

At time t10, the transfer of data D8 from the page buffer 12 to the ECC buffer 21 is completed (YES in step S16). That is, the transfer of 4096 bits of main data to the ECC buffer 21 is completed. Then, at time t11, ECC processing performed on data D8 is completed. Moreover, at time t11, data D8 starts to be transferred to the DQ buffer 31 (step S19). At time t12, the transfer is completed (YES in step S21).

<<Time t12 to time t13>>

Finally, in the period between time t12 and time t13, the parity held in the third holding unit 25 is transferred to the DQ buffer 31 (step S23, which completes a series of processes. Then, the data in the DQ buffer is stored in the memory cell array 32.

<Effect>

As described above, with the data transfer method of the first embodiment, the parity is read from the page buffer 12 earlier than the main data. Moreover, ECC processing is carried out in units into which a sector has been further divided, not in sectors. Accordingly, the transfer of data from the page buffer 12 to the ECC unit 20, the ECC processing, and the transfer of data from the ECC unit 20 to the DQ buffer 31 can be performed in parallel. As a result, the data loading speed can be increased and therefore the operating performance of the memory system can be improved. The effect will be explained in detail below.

Normally, in a NAND flash memory with the ECC function, first, all the main data is read into the ECC unit. Thereafter, the parity is read and ECC processing is carried out. In this case, the data transfer sequence of the data explained in FIG. 6, and the number of clocks needed for the sequence are as follows:

(1) Input the start address to the page buffer: 10 clocks
(2) Transfer 4096 bits of main data to the ECC unit: 64 clocks
(3) Transfer the parity to the ECC unit: 1 clock
(4) ECC process: 4 clocks
(5) Transfer 4096 bits of main data subjected to ECC processing to the DQ buffer: 64 clocks
(6) Transfer the parity to the DQ buffer: 1 clock Thus, it follows that 144 clocks are necessary for all of the processes. Since 4096 bits of main data are subjected to ECC processing simultaneously, the parity requires only 13 bits and the transfer of the parity needs 1 clock. However, the processes as a whole need 144 clocks, a very long time. This causes a problem: as the size of the main data becomes larger, the data loading speed drops extremely.

However, with the method of the first embodiment, the main data is divided into a plurality of pieces (e.g., 8 pieces) and ECC processing is carried out in units of the divided piece. The flow of data transfer in the method of the first embodiment is as follows:

(1) Input the start address of the parity to the page buffer 12: 10 clocks
(2) Transfer the parity to the ECC unit 20: 2 clocks
(3) Input the start address of the main data to the page buffer 12: 10 clocks
(4) (4-1) Transfer 4096 bits of main data to the ECC unit
(4-2) As soon as the transfer of 512 bits of main data has been completed, perform ECC processing in units of 512 bits
(4-3) As soon as 512 bits of main data has been subjected to ECC processing, transfer the main data to the DQ buffer in units of 512 bits:
item 4 as a whole needs (8×10)=80 clocks
(5) Transfer the parity to the DQ buffer: 2 clocks That is, the number of clocks necessary for all of the processes is 104 clocks. Since ECC processing is carried out in units of 512 bits, the parity needs 80 bits for every 4096 bits. In addition, not only the start address of the main data but also the start address of the parity has to be input to the page buffer 12. The transfer of the main data to the ECC unit, the ECC processing, and the transfer of the main data to the DQ buffer 31 can be carried out in parallel, which enables the data loading speed to be increased remarkably.

To realize the above method, 80 bits of parity are read earlier than the main data in the first embodiment. This suppresses the number of clocks necessary for parity reading to a minimum (2 clocks). Moreover, at the time when as much main data as equals a unit of ECC processing has been read, ECC processing can be executed immediately.

Furthermore, a plurality of main data ECC buffers (first holding unit 23 and second holding unit 24) are provided. This makes it possible to carry out the transfer of main data from the page buffer 12 to the ECC buffer 21 and the transfer of main data subjected to ECC processing to the DQ buffer 31 in parallel.

Second Embodiment

Next, a memory system and a data transfer method according to a second embodiment of the invention will be explained. The second embodiment is related to a method of carrying out ECC processing in units of 4096 bits in the first embodiment. The block configuration of the memory system of the second embodiment and a rough flow of the operation are the same as those of the first embodiment. Therefore, only what differs from the first embodiment will be explained below.

Figure 11:
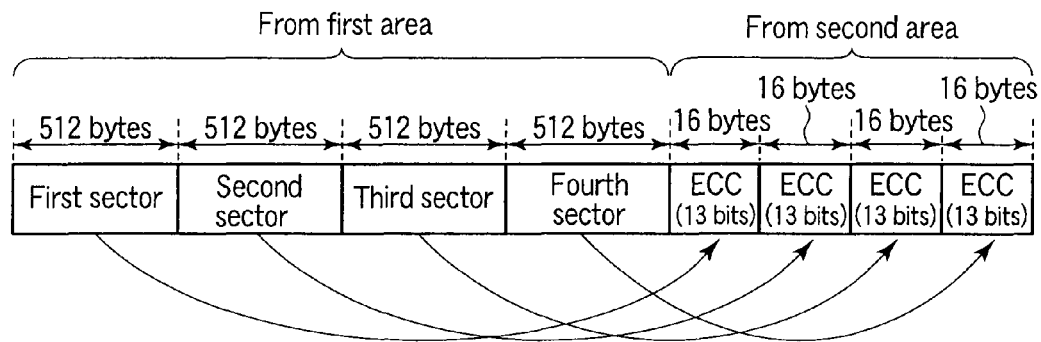
FIG. 11 is a schematic diagram of page data according to a second embodiment of the invention.

FIG. 11 is a schematic diagram of one page of data in the second embodiment. As shown in FIG. 11, the data read from the first area 17 of the memory cell array 10 is the same as that of FIG. 3 explained in the first embodiment. FIG. 11 differs from FIG. 3 in that the number of bits of parity necessary for each sector is 80 bits in the first embodiment and 13 bits in the second embodiment. The reason is that the ECC engine subjects 4096 bits to ECC processing simultaneously ($4096=2^{12}$).

Figure 12:
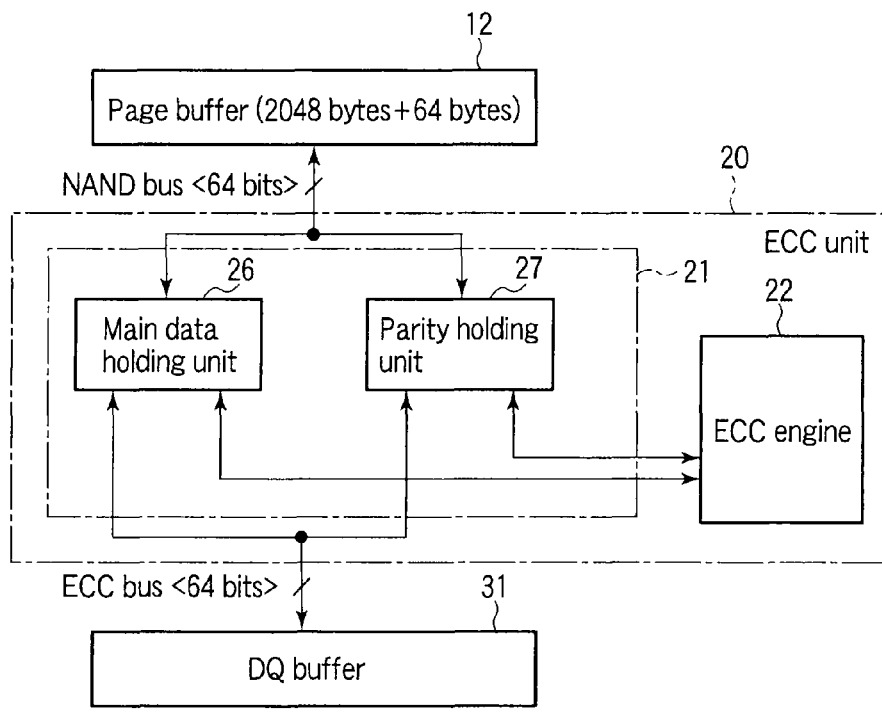
FIG. 12 is a block diagram of an EEC unit according to the second embodiment.

FIG. 12 is a block diagram of the ECC unit 20 according to the second embodiment. As shown in FIG. 12, the ECC buffer 21 includes a main data holding unit 26 and a parity holding unit 27. The main data holding unit 26 is configured to be capable of holding 4096 bits of main data. The parity holding unit 27 is the same as the third holding unit 25 explained in the first embodiment. The main data holding unit 26 and parity holding unit 27 are connected to the page buffer 12 with the NAND bus and to the DQ buffer 31 with the ECC bus.

<Method of Transferring Data Between the Page Buffer 12, ECC Unit 20, and DQ Buffer 31>

Next, a method of transferring data between the page buffer 12, ECC unit 20, and DQ buffer 31 in loading data will be explained in detail, using FIG. 13.

Figure 13:
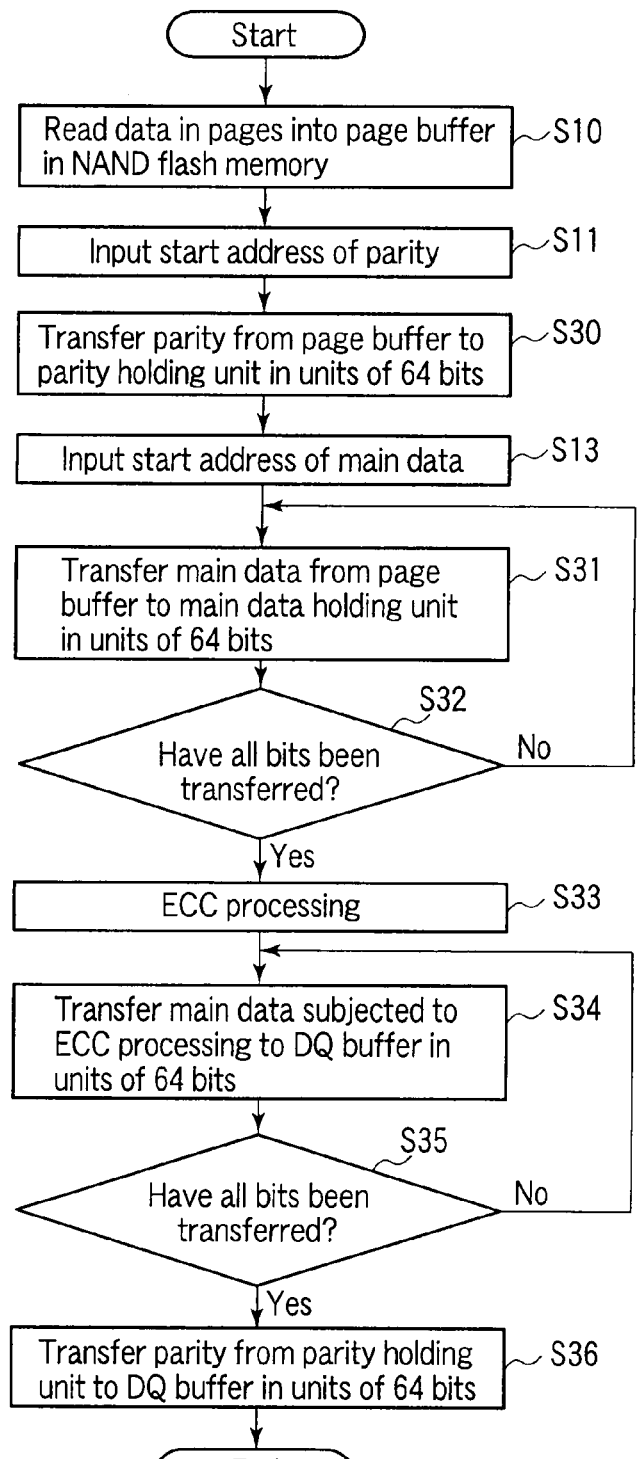
FIG. 13 is a flowchart of a data transfer method according to the second embodiment.

FIG. 13 is a flowchart of a data transfer method according to the second embodiment.

As shown in FIG. 13, after the processes in steps S10 and S11 as in FIG. 5 explained in the first embodiment, the page buffer 12 transfers the parity to the parity holding unit 27 (step S30). Then, after the process in step S13, the page buffer 12 transfers the main data to the main data holding unit 26 (step 331).

After all the bits (4096 bits) in the main data are transferred to the main data holding unit 26 (YES in step S32), the ECC engine 22 carries out ECC processing (step S33).

After ECC processing is completed, the main data is transferred to the DQ buffer (step S34). Then, after all the bits (4096 bits) in the main data are transferred to the DQ buffer 31 (YES in step S35), the parity is transferred to the DQ buffer 31 (step S36).

Concrete Example

Figure 14:
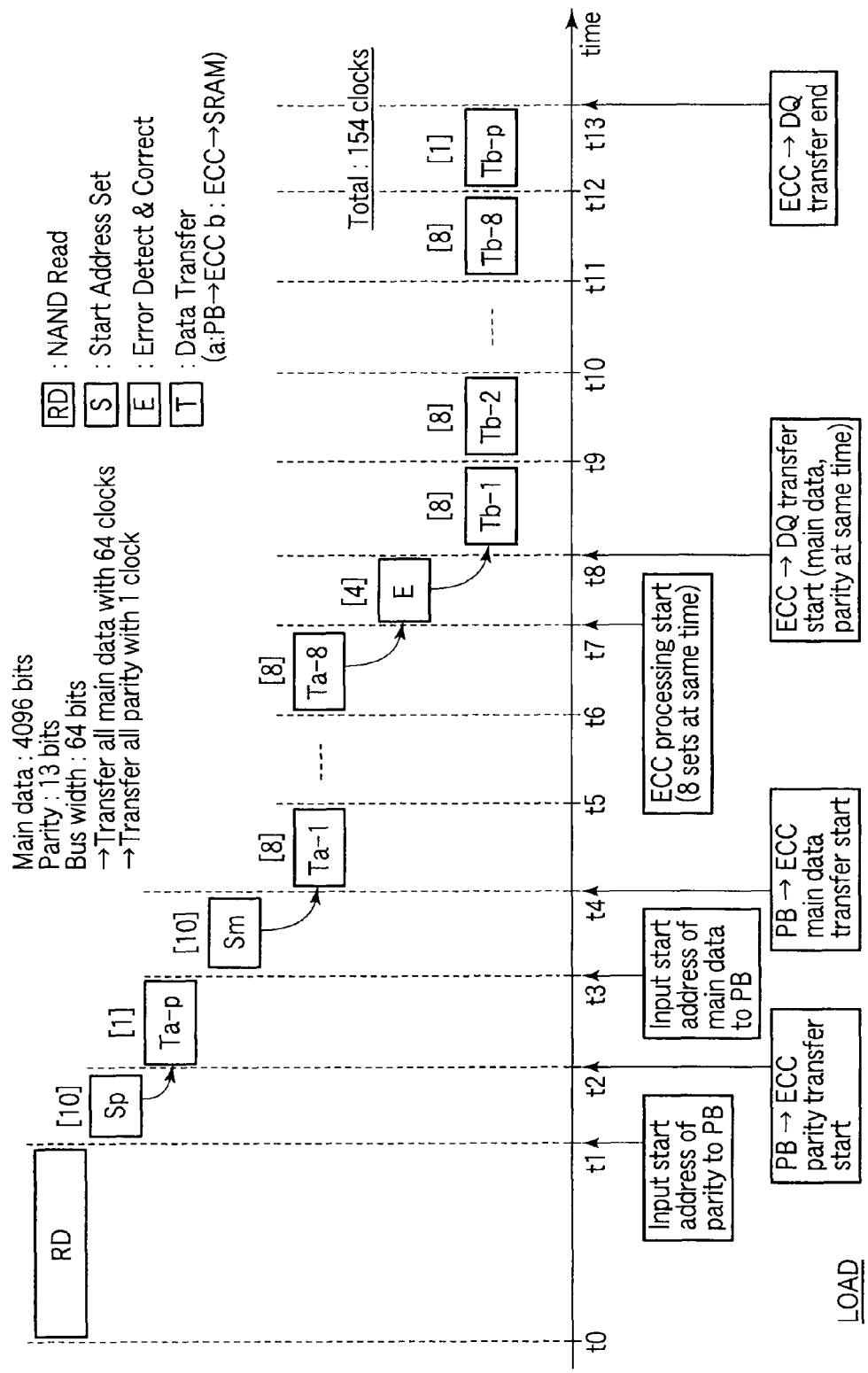
FIG. 14 is a timing chart of the data transfer method according to the second embodiment.

A concrete example of the data transfer will be explained using FIG. 14. FIG. 14 is a timing chart to explain the flow of processing from when data is read from the NAND flash memory 2 until the main data and parity are transferred to the DQ buffer 31. In FIG. 14, a number sandwiched between "["and"]" represents the number of clocks necessary to carry out the corresponding process as in FIG. 6.

<<Time t0 to Time t5>>

As shown in FIG. 14, the processes in the period between time t0 to time t5 are the same as those in FIG. 6 explained in the first embodiment (steps S10 to S31), except that the number of clocks needed for the transfer of the parity is only one in the second embodiment. The reason is that the number of bits in the parity is smaller in the second embodiment than that in the first embodiment. By time t5, 512 bits of main data are transferred to the main data holding unit 26.

<<Time t5 to Time t7>>

From time t5 on, the page buffer 12 transfers the remaining 3584 bits of main data to the main data holding unit 26 (step S31). Unlike in the first embodiment, in the period between time t5 and time t7, neither ECC processing nor the transfer of data to the DQ buffer 31 is carried out. The transfer of main data to the main data holding unit 26 needs a total of (8×8 clocks)=64 clocks.

<<Time t7 to Time t8>>

After the transfer of 4096 bits of main data is completed at time t6, the ECC engine 22 starts to carry out ECC processing. As described above, 4096 bits are subjected to ECC processing simultaneously (step S33).

<<Time t8 to Time t12>>

After ECC processing is completed at time t8, the main data subjected to ECC processing is transferred to the DQ buffer (step S34). The transfer of main data to the DQ buffer 31 requires a total of (8×8 clocks)=64 clocks.

<<Time t12 to Time t13>>

Finally, in the period between time t12 and time t13, the parity held in the parity holding unit 27 is transferred to the DQ buffer 31, which completes a series of processes. The number of clocks necessary for the transfer is one.

<Effect>

As described above, using a method of reading the parity earlier than the main data as in the first embodiment, data transfer may not be performed in parallel with ECC processing. In this case, although the number of clocks needed for all the processes is 154 as shown in FIG. 14, the number of buffers for holding main data in the ECC buffer 21 is only one (main data holding unit 26), which enables the number of bits in the parity to be decreased.

Third Embodiment

Next, a memory system and a data transfer method according to a third embodiment of the invention will be explained. The third embodiment is such that the data transfer method explained in the first embodiment is applied to a program operation. The block configuration of the memory system of the third embodiment and a rough flow of the operation are the same as those of the first embodiment. Therefore, only what differs from the first embodiment will be explained below.

Figure 15:
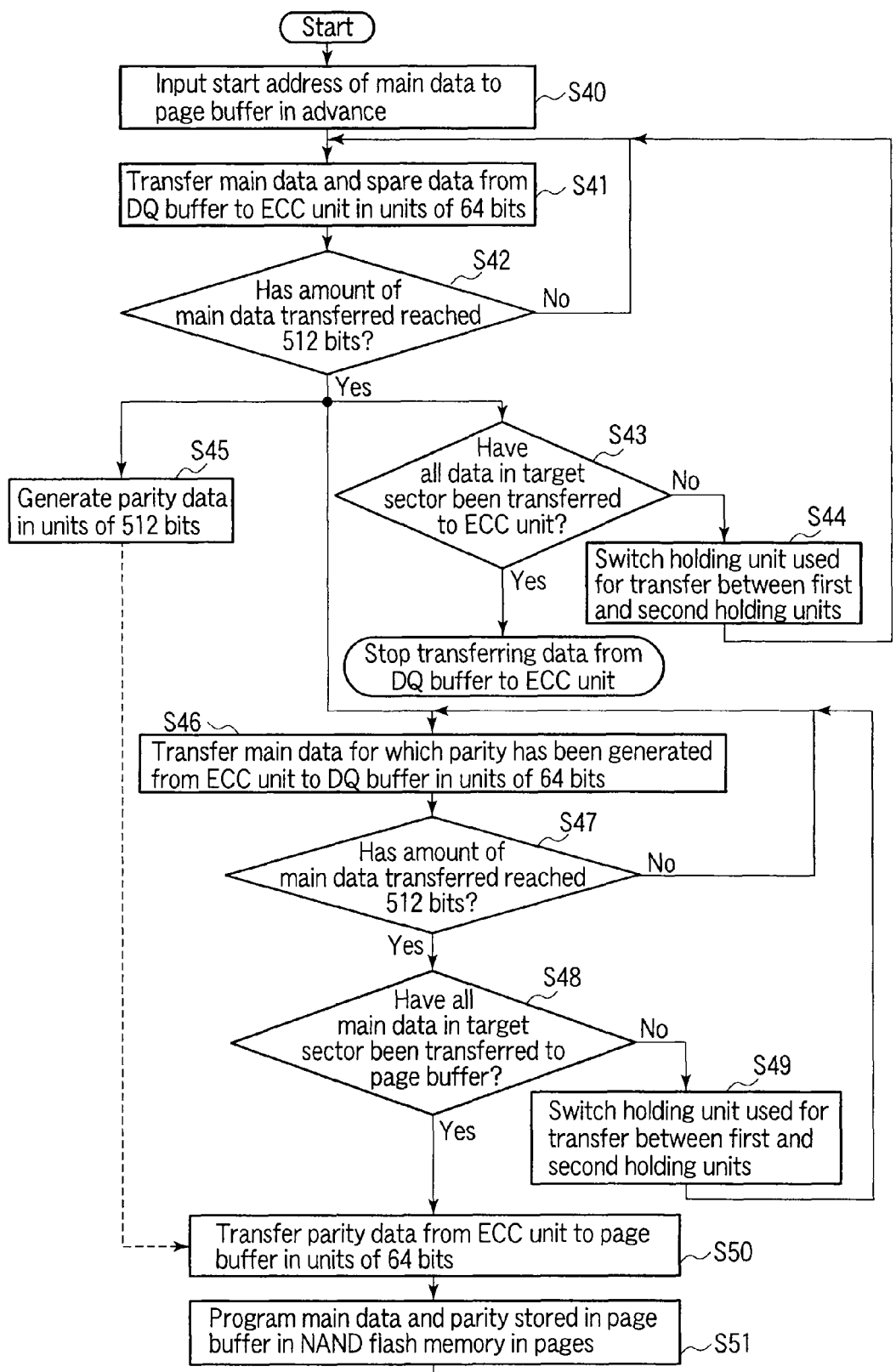
FIG. 15 is a flowchart of a data transfer method according to a third embodiment of the invention.

FIG. 15 is a flowchart to explain a method of transferring data between the DQ buffer 31, ECC unit 20, and page buffer 12 in programming data in the memory system 1 of the third embodiment. The third embodiment differs from the first embodiment explained in FIG. 5 in that the flow of data is page buffer 12→ECC unit 20→DQ buffer 31 in a load operation and DQ buffer 31→ECC unit 20→page buffer 12 in a program operation. This will be explained in detail below.

As shown in FIG. 15, according to the instruction from the address/command generator circuit 63, the sequencer 14 inputs the start address of the main data to the page buffer 12 in advance (step S40). Then, according to the instruction from the access controller 50, the DQ buffer 31 transfers the main data and spare data (spare data is data to be written to the second area of the memory cell array 10) to either the first holding unit 23 or second holding unit 24 of the ECC buffer 21 in units of 64 bits (step S41). Hereinafter, when the main data and spare data are not distinguished, they are collectively referred to as data.

If the amount of main data transferred has reached 512 bits (YES in step S42) and there are still data to be transferred in the target sector (NO in step S43), the access controller 50 switches the data transfer destination from the first holding unit 23 to the second holding unit 24 or vice versa (step S44) and resumes transferring data (step S41). If all the data in the target sector have been transferred (YES in step S43), the DQ buffer 31 stops transferring data to the ECC buffer 21. Moreover, if there is main data for which parity has already been generated, the ECC buffer 21 transfers the main data to the page buffer 12 (step S46).

If the amount of main data transferred to the page buffer 12 has reached 512 bits (YES in step S47) and all the main data in the target sector have been transferred to the page buffer 12 (YES in step S48), the ECC unit 21 transfers the parity in the third holding unit 25 to the page buffer 12 in units of 64 bits (step S50). Thereafter, the main data and parity stored in the page buffer 12 are written to the memory cell array 10 of the NAND flash memory 2 in pages (step S51).

On the other hand, if in step S48, data to be transferred to the page buffer 12 still remain in the target sector (NO in step S48), the ECC buffer 31 switches the data sender from the first holding unit 23 to the second holding unit 24 or vice versa (step S49) and resumes transferring the main data for which the parity has already been generated (step S46).

The process of transferring data from the DQ buffer 31 to the ECC buffer 21 in steps S41 to S44, the ECC processing in step S45, and the process of transferring main data from the ECC buffer 21 to the page buffer 12 in steps S46 to S49 are carried out in parallel. More specifically, as in loading data, those processes are performed in units of 512 bits, the first holding unit 23 being switched to the second holding unit 24 or vice versa. This will be explained in detail below, using a concrete example.

Concrete Example

Figure 16:
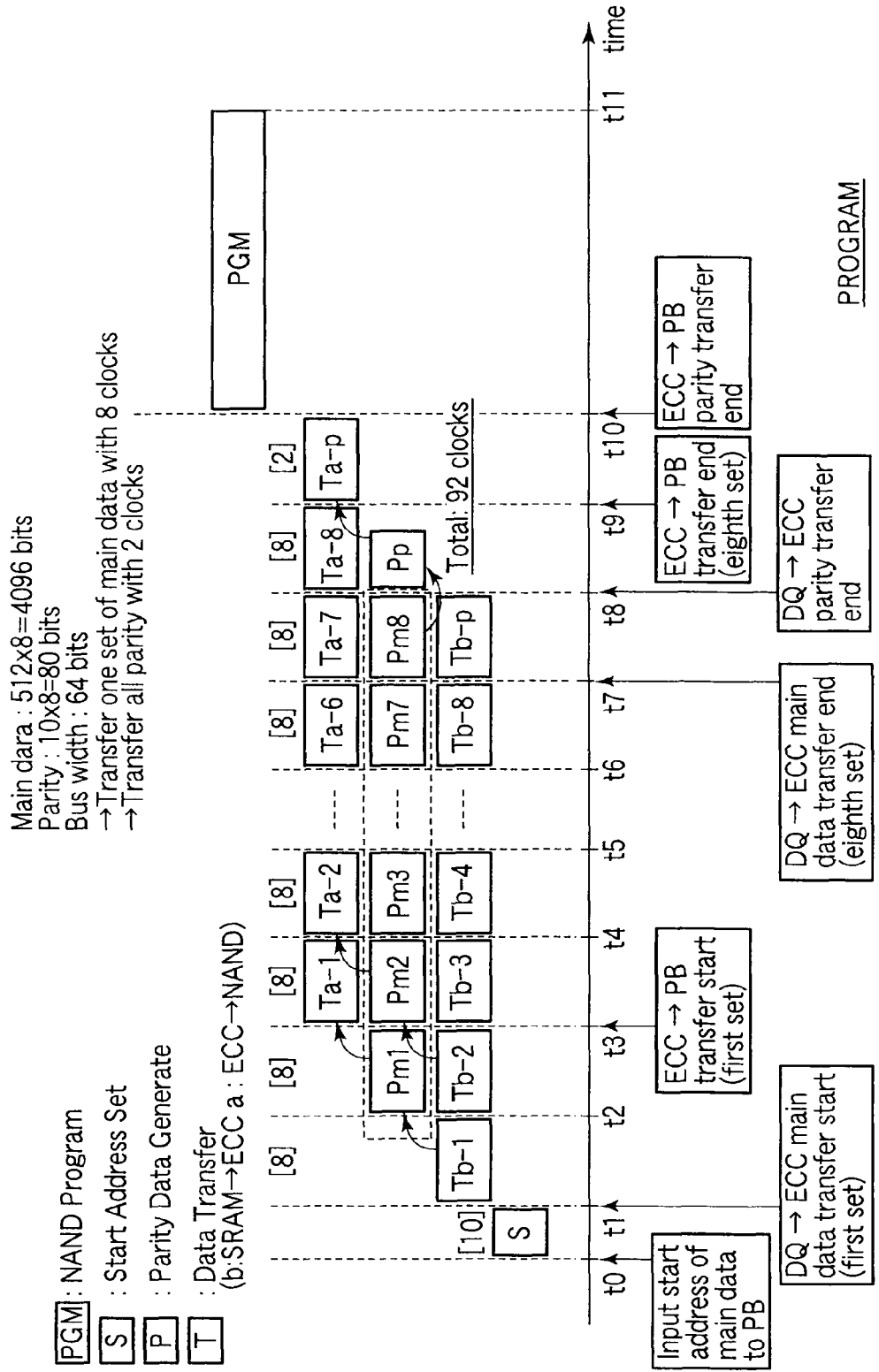
FIG. 16 is a timing chart of the data transfer method according to the third embodiment.

A concrete example of the data transfer will be explained using FIG. 16. FIG. 16 is a timing chart to explain the flow of processing from when the start address of the page buffer 12 is input in the NAND flash memory 2 until data has been programmed in the memory cell array 10. In FIG. 16, a number sandwiched between "["and"]" represents the number of clocks necessary to carry out the corresponding process.

<<Time t0 to Time t1>>

As shown in FIG. 16, in the period between time t0 and time t1, the start address of the main data is input to the page buffer 12 (step S40, "S" in FIG. 16). The input of the start address of the main data requires, for example, 10 clocks.

<<Time t1 to Time t2>>

Next, at time t1, the DQ buffer 31 transfers main data D1 to the first holding unit 23 (step S41, "Tb-1" in FIG. 16). The transfer of 512 bits of data (data D1) needs 8 clocks. At time t2, the transfer of data D1 is completed.

<<Time t2 to Time t3>>

At time t2, the DQ buffer 31 switches the transfer destination from the first holding unit 23 to the second holding unit 24 (step S44) and starts to transfer data D2 following data D1 to the second holding unit 24 (step S41, "Tb-2" in FIG. 6). The transfer of data D2 requires 8 clocks. At time t3, the transfer of data D2 is completed. At the same time, the ECC engine 22 performs ECC processing using data D1 in the first holding unit 23, thereby generating parity (step S45, "Pm-1" in FIG. 16).

<<Time t3 to Time t4>>

At time t3, the DQ buffer 31 switches the transfer destination from the second holding unit 24 to the first holding unit 23 (step S44) and starts to transfer data D3 following data D2 to the first holding unit 23 (step S41, "Tb-3" in FIG. 6). The transfer of data D3 requires 8 clocks. At time t4, the transfer of data D2 is completed. At the same time, the ECC engine 22 performs ECC processing using data D2 in the second holding unit 24, thereby generating parity (step S45, "Pm-2" in FIG. 16). Moreover, since the generation of parity for data D1 has been completed at time t3, the first holding unit 23 transfers data D1 subjected to ECC processing to the page buffer 12 in parallel with the transfer of data D3 and the ECC processing performed on data D2 (step S46, "Ta-1" in FIG. 6).

<<Time t4 to Time t7>>

From this time on, in the period between time t4 and time t7, the processes in the period from time t3 to time t4 explained above will be repeated. Specifically, in the period between time t4 and time t5, the transfer of data D4 from the DQ buffer 31 to the second holding unit 24 ("Tb-4"), the ECC processing performed on data D3 by the ECC engine 22 ("Pm3"), and the process of transferring data D2 subjected to ECC processing ("Ta-2") to the page buffer 12 are performed simultaneously. The rest is as described above. Then, at time t7, the transfer of main data from the DQ buffer 31 to the ECC buffer 21 is completed.

<<Time t7 to Time t8>>

In the period between time t7 and time t8, the transfer of the parity from the DQ buffer 31 to the third holding unit 25 ("Tb-p"), the ECC processing performed on data D8 by the ECC engine 22 ("Pm8"), and the process of transferring data D7 subjected to ECC processing ("Ta-7") to the page buffer 12 are performed simultaneously.

<<Time t8 to Time t9>>

In the period between time t8 and time t9, the ECC processing ("Pp") by the ECC engine 22 and the process of transferring data D8 subjected to ECC processing ("Ta-8") to the page buffer 12 are performed simultaneously. In ECC processing Pp, 80 bits of parity are generated on the basis of the processing results obtained in ECC processing Pm1 to Pm8. That is, parity is generated using 4096 bits of main data. The generated parity is written over the ECC buffer 21. Then, at time t9, the transfer of main data from the ECC buffer 21 to the page buffer 12 is completed (YES in step S48).

<<Time t9 to Time t10>>

In the period between time t9 and time t10, the ECC unit 20 transfers the parity held in the third holding unit 25 to the page buffer 12 (step S50).

<<Time t10 to Time t11>>

Then, the main data and parity transferred to the page buffer 12 are programmed in the memory cell array (step S51), which completes a series of processes.

<Effect>

As described above, with the data transfer method of the third embodiment, ECC processing is performed in units into which a sector has been divided as in the first embodiment. Accordingly, the transfer of data from the DQ buffer 31 to the ECC unit 20, the ECC processing, and the transfer of data from the ECC unit 20 to the page buffer 12 can be performed in parallel. As a result, the data programming speed can be increased and the operating performance of the memory system can be improved. This effect will be explained in detail below.

With a conventional NAND flash memory, after all the main data have been transferred to the ECC unit, parity is generated even in a program operation as in a load operation explained in the first embodiment, and then the main data and parity are transferred to the page buffer. Accordingly, the transfer of data from the DQ buffer to the page buffer requires 144 clocks as in a load operation.

In the method of the third embodiment, the main data is divided into a plurality of pieces (e.g., 8 pieces) and ECC processing is performed in units of the divided piece. The flow of data transfer in the method of the third embodiment is as follows:

(1) Input the start address of the main data to the page buffer 12: 10 clocks (2) (2-1) Transfer 4096 bits of main data and parity to the ECC unit (2-2) As soon as the transfer of 512 bits of main data has been completed, perform ECC processing in units of 512 bits (2-3) As soon as 512 bits of main data has been subjected to ECC processing, transfer the main data to the page buffer in units of 512 bits (2-4) Transfer the parity to the page buffer:

item 2 as a whole needs (8×10)+2=82 clocks

That is, the number of clocks necessary for all the processes is 92. Unlike in a load operation, in a program operation, parity is generated after all the main data have been prepared ("Pp" in FIG. 16). Thus, the order of transferring data from the DQ buffer 31 to the ECC buffer 21 is main data parity. Accordingly, the start address of the main data has to be input only once. Consequently, the programming speed can be increased remarkably.

Fourth Embodiment

Next, a memory system according to a fourth embodiment of the invention will be explained. The fourth embodiment relates to a method of transferring a clock and data in the memory system explained in the first to third embodiments. Hereinafter, only what differs from the first to third embodiments will be explained.

<About a Transfer Path of a Clock and Data>

Figure 17:
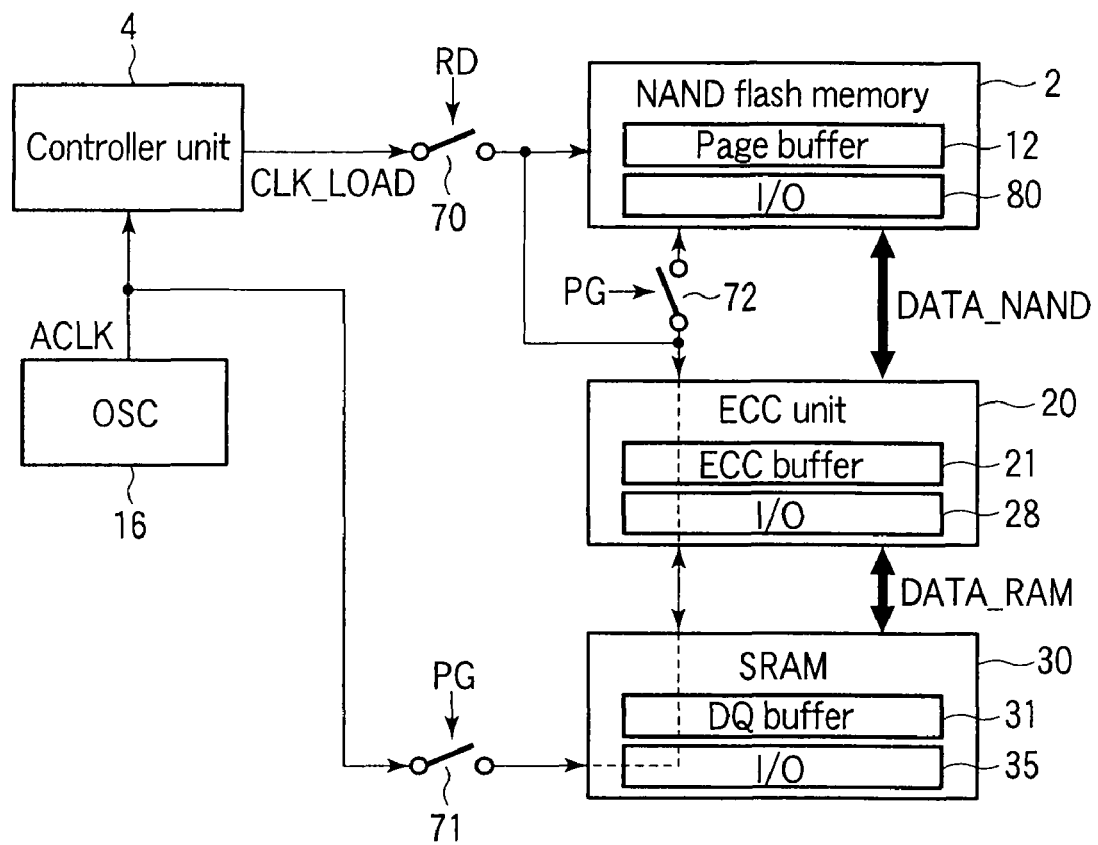
FIG. 17 and FIG. 18 are block diagrams of the memory system according to the fourth embodiment of the invention.

FIG. 17 is a block diagram of a part of the memory system 1 of the fourth embodiment, particularly focusing on a transfer path of a clock and data. FIG. 17 shows only a part of the internal structure of each of the NAND flash memory 2, ECC unit 20, and SRAM 30 which is related to the forth embodiment.

As shown in FIG. 17, the memory system 1 includes switches 70 to 72 for propagating a clock. The switch 70 switches the propagation of a clock between the controller unit 4 and the NAND flash memory 2. The switch 70 is turned on in loading data. The switch 71 switches the propagation of a clock between the oscillator 16 and the SRAM 30. The switch 71 is turned on in programming data. The switch 72 switches the propagation of a clock between the controller unit 4 and ECC unit 20 and the NAND flash memory 2. The switch 72 is turned on in programming data.

The NAND flash memory 2, ECC unit 20, and SRAM 30 include input/output units (I/O) 80, 28, 35, respectively, in addition to the configuration explained in the first to third embodiments. Data is input to or output from the outside via the input/output units 80, 28, 35 in synchronization with a clock.

Hereinafter, data exchanged between the NAND flash memory 2 and the ECC unit 20 is referred to as data DATA_NAND. Data exchanged between the ECC unit 20 and the SRAM 30 is referred to as data DATA_RAM.

<About Loading Data>

Next, the propagation of a clock and data in loading data will be explained using FIG. 18. Like FIG. 17, FIG. 18 is a block diagram of the memory system 1, particularly showing the way data is loaded.

Figure 18:
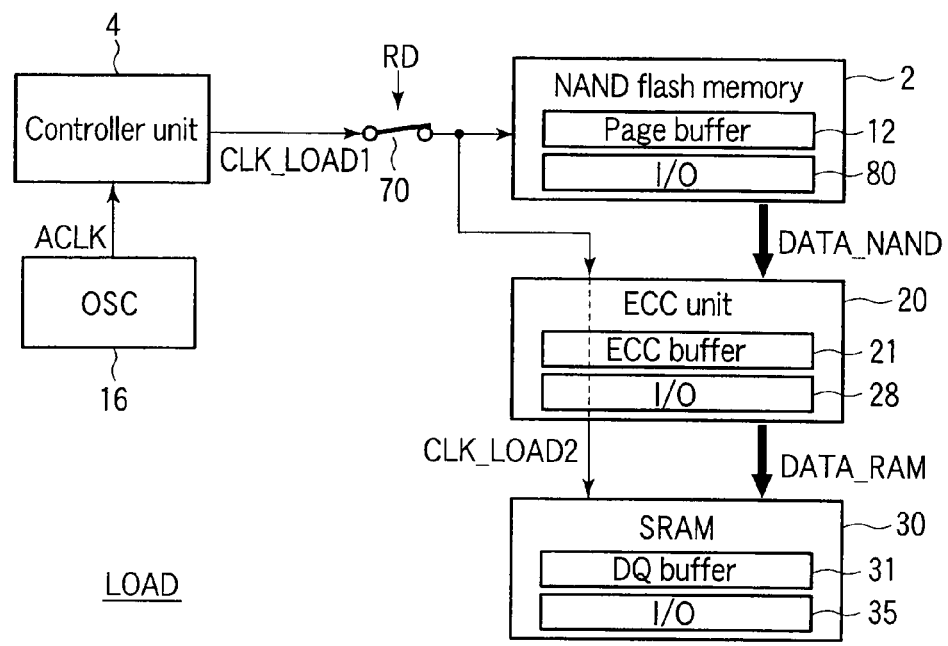

As shown in FIG. 18, the switch 70 is turned on and the switches 71, 72 are turned off. The oscillator 16 generates an internal clock ACLK and supplies it to the controller unit 4. The controller unit 4 operates in synchronization with the internal clock ACLK and, on the basis of the internal clock ACLK, generates an internal clock CLK_LOAD1.

The internal clock CLK_LOAD1 is supplied via the switch 70 to the NAND flash memory 2. The NAND flash memory 2 operates in synchronization with the internal clock CLK_LOAD1. Its input/output unit 80 outputs data DATA_NAND (main data and parity) to the ECC unit 20 in synchronization with the internal clock CLK_LOAD1.

The internal clock CLK_LOAD1 is supplied not only to the NAND flash memory 2 but also to the ECC unit 20. The ECC unit 20 operates in synchronization with the internal clock CLK_LOAD1. Accordingly, the input/output unit 28 of the ECC unit 23 takes in data DATA_NAND supplied from the NAND flash memory 2 in synchronization with the internal clock CLK_LOAD1.

Moreover, the ECC unit 20 subjects the internal clock CLK_LOAD1 to processes, including waveform shaping, with a delay circuit (not shown), a buffer, and others, thereby generating an internal clock CLK_LOAD2. Then, after having performed ECC processing, the ECC unit 20 outputs data DATA_RAM (error-corrected main data and parity) from the input/output unit 28 to the SRAM 30 in synchronization with the internal clock CLK_LOAD2.

The ECC unit 30 supplies data DATA_RAM together with the internal clock CLK_LOAD2 to the SRAM 30. The SRAM 30 operates in synchronization with the internal clock CLK_LOAD2. Accordingly, the input/output unit 35 of the SRAM 30 takes in data DATA_RAM supplied from the ECC unit 20 in synchronization with the internal clock CLK_LOAD2.

Figure 19:
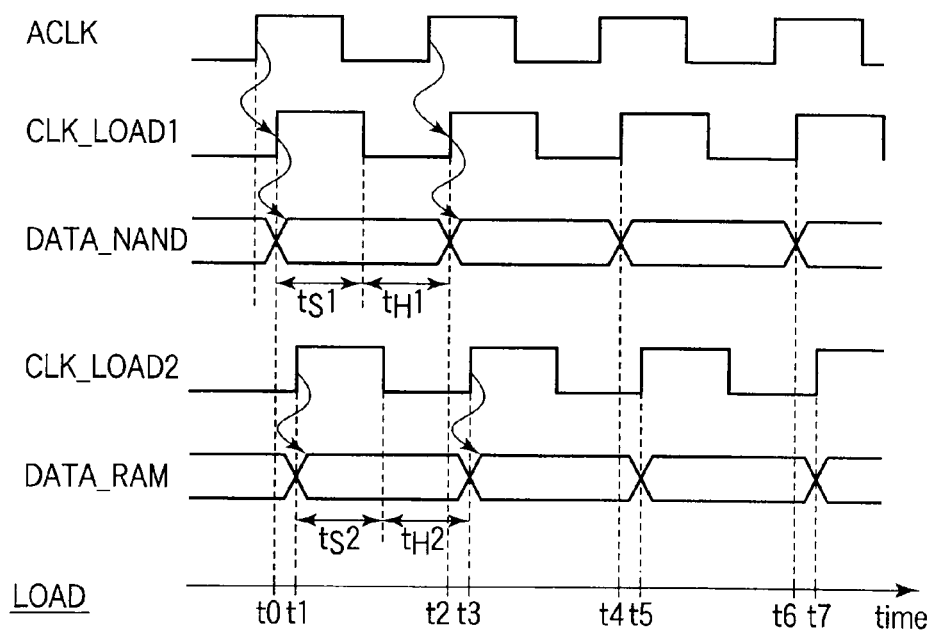
FIG. 19 is a timing chart of data and a clock of the memory system in a load operation according to the fourth embodiment.

FIG. 19 is a timing chart of the internal clocks ACLK, CLK_LOAD1, CLK_LOAD2, and DATA_NAND, DATA_RAM in loading data.

As shown in FIG. 19, data DATA_NAND is output from the NAND flash memory 2 in synchronization with the internal clock CLK_LOAD1 and is taken in by the ECC unit 20. Data DATA_RAM is output from the ECC unit 20 in synchronization with the internal clock CLK_LOAD2 and is taken in by the SRAM 30.

<About Data Programming>

Next, the way a clock and data are propagated in programming data will be explained using FIG. 20. Like FIG. 18, FIG. 20 is a block diagram of the memory system 1, particularly showing data programming.

As shown in FIG. 20, the switches 71, 72 are turned on and the switch 70 is turned off. The oscillator 16 generates an internal clock ACLK and supplies it to the controller unit 4. The controller unit 4 operates in synchronization with the internal clock ACLK.

The internal clock ACLK is also supplied via the switch 71 to the SRAM 30. The SRAM 30 operates in synchronization with the internal clock CLK_LOAD1. Its input/output unit 31 outputs data DATA_NAND (main data and parity) to the ECC unit 20 in synchronization with the internal clock ACLK.

The SRAM 30 supplies not only data DATA_RAM but also an internal clock to the ECC unit 20. The internal clock is generated at the SRAM 30 on the basis of the internal clock ACLK and, hereinafter, is referred to as internal clock CLK_PG1. The ECC unit 20 operates in synchronization with the internal clock CLK_PG1. Accordingly, the ECC unit 20 takes in data DATA_RAM supplied from the SRAM 30 in synchronization with the internal clock CLK_PG1.

Moreover, the ECC unit 20 subjects the internal clock CLK_PG1 to processes, including waveform shaping, with a delay circuit (not shown), a buffer, and others, thereby generating an internal clock CLK_PG2. Then, the ECC unit 20 outputs data DATA_NAND (main data and generated parity) to the NAND flash memory 2 in synchronization with the internal clock CLK_PG2.

The ECC unit 30 supplies data DATA_NAND together with the internal clock CLK_PG2 to the NAND flash memory 2. The NAND flash memory 2 operates in synchronization with the internal clock CLK_PG2. Accordingly, the NAND flash memory 2 takes in data DATA_NAND supplied from the ECC unit 20 in synchronization with the internal clock CLK_PG2.

FIG. 21 is a timing chart of the internal clocks ACLK, CLK_PG1, CLK_PG2, and data DATA_NAND, DATA_RAM in programming data.

As shown in FIG. 21, data DATA_RAM is output from the NAND flash memory 2 in synchronization with the internal clock CLK_PG1 and is taken in by the ECC unit 20 in synchronization with the internal clock CLK_PG1. Data DATA_NAND is output from the ECC unit 20 in synchronization with the internal clock CLK_PG2 and is taken in by the NAND flash memory 2.

<Effect>

As described above, with the memory system of the fourth embodiment, the internal clock is propagated according to the flow of data transfer between the individual functional blocks. In other words, the reference clock is caused to differ between data loading and data programming, thereby performing data transfer in synchronization with a clock. This makes it possible to increase data transfer accuracy in the memory system 1 and improve the operation reliability of the memory system. This effect will be explained below.

As a mobile phone has more and more functions and higher performance these days, the mobile phone system becomes increasingly diversified and various types of systems are currently in use. The memory used in each system has the best suited combination of type and capacity. One of them is the memory system 1 shown in FIG. 1. In the memory system 1, the controller unit 4, NAND flash memory 2, the NOR interface with a high-speed read performance (interface unit 40), SRAM 30 acting as a buffer memory, and the ECC unit 20 with a data correcting function are integrated into one chip.

When a plurality of circuit blocks (systems) are integrated into one chip, the technique for improving the accuracy of data transfer between a plurality of systems is important.

Figure 22:
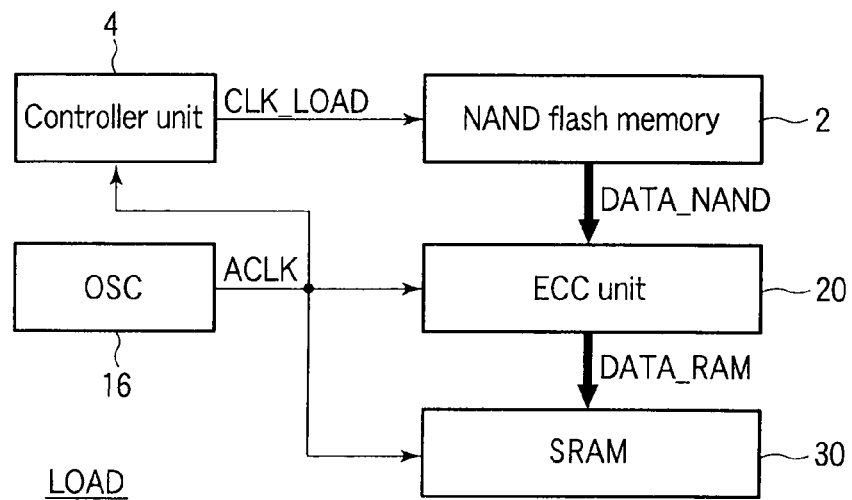
FIG. 22 is a block diagram of a memory system in a load operation.

When a plurality of systems are caused to operate on the basis of a clock generated by a clock generator, the following problem arises. FIG. 22 is a block diagram of a system which includes the controller unit 4, NAND flash memory 2, ECC unit 20, and SRAM 30.

With this configuration, the ECC unit 20 and SRAM 30 operate in synchronization with an internal clock ACLK generated by the oscillator 16. The controller unit 4 generates an internal clock CLK_LOAD on the basis of the internal clock ACLK. The NAND flash memory 2 operates in synchronization with the internal clock CLK_LOAD.

Figure 23:
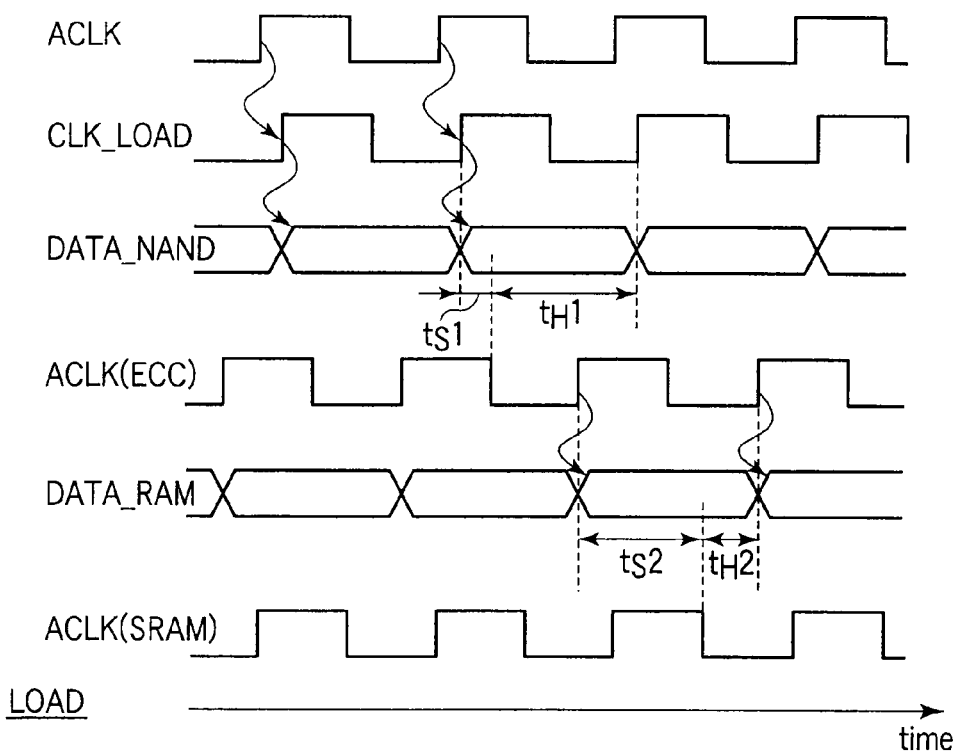
FIG. 23 is a timing chart of data and a clock in a load operation.

FIG. 23 is a timing chart of various signals in this case. In FIG. 23, "ACLK" represents a clock generated by the oscillator 16. "ACLK (ECC)" and "ACLK (SRAM)" represent clocks actually input to the ECC unit 20 and SRAM 30, respectively.

The internal clocks ACLK (ECC), ACLK (SRAM) are signals obtained by delaying the internal clock ACLK. The delay in the path from the oscillator 16 to the ECC unit 20 normally differs from the delay in the path from the oscillator 16 to the SRAM 30. Sometimes, the difference between them is very large. Moreover, the difference in the amount of delay between them has nothing to do with the amount of delay caused when data DATA_RAM is transferred from the ECC unit 20 to the SRAM 30. Similarly, the phase difference between internal clocks ACLK and CLK_LOAD (difference in the amount of delay between them) has nothing to do with the amount of delay caused when data DATA_NAND is transferred from the NAND flash memory 2 to the ECC unit 20.

As a result, in an example shown in FIG. 23, in data DATA_NAND, setup time $t_S1$ is extremely shorter than hold time $t_H1$. Moreover, in data DATA_RAM, hold time $t_H2$ is extremely shorter than setup time $t_H2$. Accordingly, a great imbalance between setup time and hold time occurs, which causes the problem of making very severe timing control for transferring data accurately. To improve the imbalance, it is necessary to adjust the wiring delay, which is very difficult.

A similar problem occurs in a program operation. FIGS. 24 and 25 are a block diagram of the system and a timing chart of various signals in a program operation, respectively. As shown in FIGS. 24 and 25, in this case, too, the imbalance between setup time $t_S1$ and hold time $t_H1$ and the imbalance between setup time $t_S2$ and hold time $t_H2$ occur in data DATA_RAM and data DATA_NAND.

However, with the configuration of the fourth embodiment, the above problem can be solved. Specifically, as explained using FIGS. 18 and 20, the internal clocks used in each circuit block is switched, depending on whether a load or a program operation is performed. Moreover, the direction in which the internal clock propagates is set in the direction in which data is propagated. For example, the wiring lines which transfer data are arranged in parallel with the wiring lines which transfer clocks. They have almost the same wiring line length. Accordingly, the amount of delay in the internal clock is almost the same as that caused in the data, thereby solving the above problem.

More specifically, in loading data, the difference between the time required for internal clock CLK_LOAD1 to reach the NAND flash memory 2 and the time required for the internal clock CLK_LOAD1 to reach the ECC unit 20 is almost the same as the time required for data DATA_NAND to reach the ECC unit 20 from the NAND flash memory 2. Moreover, the time required for internal clock CLK_LOAD2 to reach the SRAM 30 from the ECC unit 20 is almost the same as the time required for data DATA_RAM to reach the SRAM 30 from the ECC unit 20. Accordingly, as shown in FIG. 19, setup time $t_S1$ and hold time $t_H1$ in data DATA_NAND and data DATA_RAM can be made almost equal.

Furthermore, in programming data, the time required for the internal clock CLK_PG1 to reach the ECC unit 20 from the SRAM 30 is almost the same as the time required for data DATA_RAM to reach the ECC unit 20 from the SRAM 30. In addition, the time required for the internal clock CLK_PG2 to reach the NAND flash memory 2 from the ECC unit 20 is almost the same as the time required for data DATA_NAND to reach NAND flash memory 2 from the ECC unit 20. Accordingly, as shown in FIG. 21, setup time $t_S2$ and hold time $t_H2$ in data DATA_NAND and data DATA_RAM can be made almost equal.

As a result, the accuracy of data transfer between the individual circuit blocks in the memory system 1 can be increased and jitters due to a delay in the lines can be improved remarkably.

As described above, with a memory system according to the first to fourth embodiments, the performance of data transfer between blocks can be improved in a semiconductor device where a NAND flash memory as a main memory, an SRAM as a buffer, an ECC unit with an error correcting function, and a controller are formed on the same semiconductor substrate. This enables the performance and reliability of the memory system to be improved.

The first and second embodiments may be combined with the third embodiment. Specifically, the data transfer method explained in the first or second embodiment may be used in loading data and the data transfer method explained in the third embodiment may be used in programming data. In this case, the fourth embodiment may be combined with at least one of the first to third embodiments, or may not be combined with any one of them. That is, in the fourth embodiment, the parity may be transferred later than the main data.

Furthermore, in the first to third embodiments, the number of clocks needed for each process (number of clocks needed for the individual circuit blocks and number of clocks necessary for ECC processing) is only illustrative and may differ from what has been described above. Moreover, the case where 4096 bits (512 bytes) of main data have been subjected to ECC processing has been explained. However, when the size of the page buffer 12 is 2 Kbytes, data of the page size can be transferred by repeating data transfer explained in FIG. 6, 14, or 16 four times.

In the third embodiment, the parity is transferred from the DQ buffer 31 to the ECC buffer 21 in the transfer process Tb-p. However, in process Pp, parity is generated according to the results of processes Pm1 to Pm8 already performed and this parity is written over the parity generated in Tb-p. Accordingly, the transfer process Tb-p may be omitted.

Similarly, in loading data, after the parity is used for ECC processing, it becomes unnecessary. Accordingly, the transfer process Tb-p explained in the first and second embodiments may be omitted. However, an area for storing parity is provided in the DQ buffer 31 and memory cell array 32 and parity is transferred to the area in the same manner as transferring main data, making it possible to check whether the parity has been generated properly in the ECC processing.

Furthermore, while in the fourth embodiment, data has been input or output in synchronization with the up edge of the clock, data may be input or output in synchronization with the down edge.

While in the first to fourth embodiments, a case where the NAND flash memory 2, RAM unit 3, and controller unit 4 have been integrated into one chip has been explained. A concrete example of such a memory system 2 is a OneNAND (registered trademark) flash memory. However, the NAND flash memory 2, RAM unit 3, and controller unit 4 are not necessarily integrated into one chip and may be realized in separate semiconductor chips.

Specifically, (1) A data transfer method according the above embodiments including: step S10 of reading data from a NAND flash memory 10 in pages into a first buffer 12; step S12 of transferring parity in the data read into the first buffer 12 to a second buffer 21; steps S14 to S17 of, after transferring the parity to the second buffer 21, transferring main data in the data read into the first buffer 12 to the second buffer 21; step S18 of, on the basis of the parity, correcting an error in the main data transferred to the second buffer 21; and step S19 of transferring the error-corrected main data to a third buffer 31.

(2) In item 1, the main data is divided into N groups D1 to D8 (N is a natural number not less than 3) and the N groups D1 to D8 are transferred sequentially from the first buffer 12 to the second buffer 21, and in the period during which an i-th group Di (i is a natural number and meets the expression i≦N) is transferred from the first buffer 12 to the second buffer 21, an error in an (i−1)th group D(i−1) is corrected and an error-corrected (i−2)th group D(i−2) is transferred to the third buffer 31.

(3) In item 2, the second buffer 21 includes a first data holding unit 23 and a second data holding unit 24 which are capable of holding data, and in the period during which the i-th group Di is transferred to the first data holding unit 23, the second data holding unit 24 is used to correct an error in the (i−1)th group D(i−1).

(4) In item 1, the NAND flash memory 10 includes a first area 17 capable of holding the main data and a second area 18 capable of holding the parity, and each of the first to third buffers 12, 21, 31 includes an area corresponding to the main data in the first area 17 and an area corresponding to the parity in the second area 18.

(5) In item 1, the transfer of the main data from the first buffer 12 to the second buffer 21, the process of correcting an error in the main data, and the transfer of the main data from the second buffer 21 to the third buffer 31 are performed in units obtained by dividing the main data into a plurality of groups.

(6) A data transfer method according to above embodiments including: steps S41 to S44 of transferring main data from a first buffer 31 to a second buffer 21; step S46 of causing an error correcting circuit 22 to generate parity for the main data transferred to the second buffer 21; step S47 of transferring the main data and the parity to a third buffer 12; and step S50 of programming the main data and the parity in the NAND flash memory 10 in pages. The main data is divided into N groups D1 to D8 (N is a natural number not less than 3). The N groups are transferred sequentially from the first buffer 31 to the second buffer 21. In the period during which an i-th group Di (i is a natural number and meets the expression (i+2)≦N) is transferred from the second buffer 21 to the third buffer 12, the parity is generated for an (i+1)th group D(i+1) and an (i+2)th group D(i+2) is transferred from the first buffer 31 to the second buffer 21 in the.

(7) In item 6, the second buffer 21 includes a first data holding unit 23 and a second data holding unit 24 which are capable of holding data, and in the period during which the i-th group Di is transferred to the first data holding unit 23, the second data holding unit 24 is used to generate the parity for the (i−1)th group D(i−1).

(8) In item 6, the transfer of the main data from the first buffer 31 to the second buffer 21, the process of generating the parity for the main data, and the transfer of the main data from the second buffer 21 to the third buffer 12 are performed in units obtained by dividing the main data into a plurality of groups.

(9) In any one of items 1 to 8, the bus width of a first transfer path which transfers data between the first buffer and the second buffer is equal to the bus width of a second transfer path which transfers data between the second buffer and the third buffer.

(10) In item 9, the second buffer 21 is capable of inputting and outputting the main data simultaneously.

(11) A memory system according to the embodiments includes: a NAND flash memory 2 which is capable of holding data; an ECC system 20 which performs ECC processing on the data; a buffer memory 30 which is used to input and output the data to and from the NAND flash memory; and a controller 4 which controls the operations of the NAND flash memory 2, the ECC system 20, and the buffer memory 20. The direction in which a clock is propagated between the NAND flash memory 2, ECC system 20, buffer memory 30, and controller 4 is switched depending on whether the data is loaded or programmed.

(12) In item 11, the system further includes a clock generator 16 which generates a first clock ACLK.

When the data is programmed, the data is transferred from the buffer memory 30 to the NAND flash memory 2 via the ECC system 20, the buffer memory 30 generates a second clock CLK_PG1 on the basis of the first clock ACLK and transfers the second clock CLK_PG1 and the data to the ECC system 20 in synchronization with the second clock CLK_PG1, the ECC system 20 generates not only parity for the data but also a third clock CLK_PG2 on the basis of the second clock and transfers the third clock CLK_PG2 and the data to the NAND flash memory 2 in synchronization with the third clock CLK_PG2, and the NAND flash memory 2 receives the data in synchronization with the third clock CLK_PG2.

(13) In item 11, the system further includes a clock generator 16 which generates a first clock ACLK. When the data is loaded, the controller 4 generates a second clock CLK_LOAD1 on the basis of the first clock ACLK, the NAND flash memory 2 transfers the data to the ECC system 20 in synchronization with the second clock CLK_LOAD1, the ECC system 20 receives the data in synchronization with the second clock CLK_LOAD1, detects and corrects an error in the data, generates a third clock CLK_LOAD2 on the basis of the second clock CLK_LOAD1, and outputs the third clock CLK_LOAD2 and the data to the buffer memory 30 in synchronization with the third clock CLK_LOAD2, and the buffer memory 30 receives the data in synchronization with the third clock CLK_LOAD2.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data transfer method comprising:
reading data from a NAND flash memory in pages into a first buffer;
transferring a parity in the data read into the first buffer to a second buffer;

after transferring the parity to the second buffer, transferring a main data in the data read into the first buffer to the second buffer;
on the basis of the parity, correcting an error in the main data transferred to the second buffer; and
transferring an error-corrected main data to a third buffer,
wherein the main data is divided into N groups (N is a natural number not less than 3), and the N groups are transferred sequentially from the first buffer to the second buffer, and
in the period during which an i-th group (i is a natural number and meets the expression i≦N) is transferred from the first buffer to the second buffer, an error in an (i−1)th group is corrected and an error-corrected (i−2)th group is transferred to the third buffer.

2. The method according to claim 1, wherein the second buffer includes a first data holding unit and a second data holding unit which are capable of holding data, and
in the period during which the i-th group is transferred to the first data holding unit, the second data holding unit is used to correct an error in the (i−1)th group.

3. The method according to claim 1, wherein the NAND flash memory includes a first area capable of holding the main data and a second area capable of holding the parity, and
each of the first to third buffers includes an area corresponding to the main data in the first area and an area corresponding to the parity in the second area.

4. The method according to claim 1, wherein a transfer of the main data from the first buffer to the second buffer, a process of correcting an error in the main data, and a transfer of the main data from the second buffer to the third buffer are performed in units obtained by dividing the main data into a plurality of groups.

5. The method according to claim 1, wherein a bus width of a first transfer path which transfers data between the first buffer and the second buffer is equal to a bus width of a second transfer path which transfers data between the second buffer and the third buffer.

6. The method according to claim 5, wherein the second buffer is capable of inputting and outputting the main data simultaneously.

7. The method according to claim 1, wherein the second buffer is a buffer memory included in an ECC system which performs an error correcting process, and
the third buffer is a buffer memory included in an SRAM which functions as a buffer memory of the NAND flash memory.

8. A data transfer method comprising:
transferring main data from a first buffer to a second buffer, the main data being divided into N groups (N is a natural number not less than 3) and the N groups being transferred sequentially from the first buffer to the second buffer;
causing an error correcting circuit to generate parity for the main data transferred to the second buffer;
transferring the main data and the parity to a third buffer, not only parity being generated for an (I+1)th group but also an (i+2)th group being transferred from the first buffer to the second buffer in the period during which an i-th group (i is a natural number and meets the expression (i+2)≦N) is transferred from the second buffer to the third buffer; and
programming the main data and the parity in the NAND flash memory in pages.

9. The method according to claim 8, wherein the second buffer includes a first data holding unit and a second data holding unit which are capable of holding data, and
in the period during which the i-th group is transferred to the first data holding unit, the second data holding unit is used to generate the parity for the (i−1)th group.

10. The method according to claim 8, wherein a transfer of the main data from the first buffer to the second buffer, a process of generating the parity for the main data, and a transfer of the main data from the second buffer to the third buffer are performed in units obtained by dividing the main data into a plurality of groups.

11. The method according to claim 8, wherein a bus width of a first transfer path which transfers data between the first buffer and the second buffer is equal to a bus width of a second transfer path which transfers data between the second buffer and the third buffer.

12. The method according to claim 11, wherein the second buffer is capable of inputting and outputting the main data simultaneously.

13. The method according to claim 8, wherein the third buffer is a buffer memory included in an SRAM which functions as a buffer memory of the NAND flash memory, and
the second buffer is a buffer memory included in an ECC system which performs the error correcting process.

14. A memory system comprising:
a NAND flash memory which is capable of holding data;
an ECC system which performs ECC processing on the data;
a buffer memory which is used to input and output the data to and from the NAND flash memory;
a controller which controls the operations of the NAND flash memory, the ECC system, and the buffer memory, a direction in which a clock is propagated between the NAND flash memory, ECC system, buffer memory, and the controller being switched depending on whether the data is loaded or programmed;
a clock generator which generates a first clock,
wherein, when the data is programmed,
the data is transferred from the buffer memory to the NAND flash memory via the ECC system,
the buffer memory generates a second clock on a basis of the first clock and transfers the second clock and the data to the ECC system in synchronization with the second clock,
the ECC system generates not only parity for the data but also a third clock on a basis of the second clock and transfers the third clock and the data to the NAND flash memory in synchronization with the third clock, and
the NAND flash memory receives the data in synchronization with the third clock.

15. The system according to claim 14,
wherein, when the data is loaded,
the controller generates a fourth clock on the basis of the first clock,
the NAND flash memory transfers the data to the ECC system in synchronization with the fourth clock,
the ECC system receives the data in synchronization with the second clock, detects and corrects an error in the data, generates a fifth clock on the basis of the fourth clock, and outputs the fifth clock and the data to the buffer memory in synchronization with the fifth clock, and
the buffer memory receives the data in synchronization with the fifth clock.

16. The system according to claim 15, further comprising:
a third switch which is provided between the controller and the ECC system and between the controller and the NAND flash memory, the third switch turning on to transfer the fourth clock from the controller to the ECC system and the NAND flash memory when the data is loaded, and the third switch turning off when the data is programmed.

17. The system according to claim 14, wherein the NAND flash memory, the ECC system, the buffer memory, and the controller are formed on a same semiconductor substrate.

18. The system according to claim 17, wherein the buffer memory is an SRAM.

19. The system according to claim 14, further comprising:
a first switch which is provided between the clock generator and the buffer memory, the first switch turning on to transfer the first clock from the clock generator to the buffer memory when the data is programmed, and the first switch turning off when the data is loaded, and
a second switch which is provided between the ECC system and the NAND flash memory, the second switch turning on to transfer the third clock from the ECC system to the NAND flash memory when the data is programmed, and the second switch turning off when the data is loaded.

* * * * *